US012644923B2

(12) United States Patent
Futatsuyama et al.

(10) Patent No.: US 12,644,923 B2
(45) Date of Patent: Jun. 2, 2026

(54) CIRCUIT FOR DETECTING DEFECTS

(71) Applicant: SAMSUNG ELECTRONICS CO., LTD., Suwon-si (KR)

(72) Inventors: Takuya Futatsuyama, Suwon-si (KR); Wandong Kim, Suwon-si (KR); Kiwhan Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 200 days.

(21) Appl. No.: 18/667,974

(22) Filed: May 17, 2024

(65) Prior Publication Data

US 2025/0085340 A1    Mar. 13, 2025

(30) Foreign Application Priority Data

Sep. 13, 2023    (KR) ........................ 10-2023-0121920

(51) Int. Cl.
*G01R 31/28*        (2006.01)
*H01L 21/66*        (2006.01)

(52) U.S. Cl.
CPC ..... *G01R 31/2894* (2013.01); *G01R 31/2856* (2013.01); *G01R 31/2879* (2013.01); *H01L 22/32* (2013.01)

(58) Field of Classification Search
CPC ........ G01R 27/00; G01R 27/02; G01R 27/26; G01R 27/2605; G01R 31/00; G01R 31/28; G01R 31/2851; G01R 31/2853; G01R 31/2855; G01R 31/2856; G01R 31/2872; G01R 31/2879; G01R 31/2884; G01R 31/2894; G01R 31/317; G01R 31/3181; G01R 31/3187; H01L 22/00; H01L 22/10; H01L 22/12; H01L 22/30; H01L 22/32; H01L 22/34

(Continued)

(56) References Cited

U.S. PATENT DOCUMENTS 7,649,200 B1    1/2010   Miller et al.
9,159,646 B2   10/2015   Xie et al.
(Continued)

FOREIGN PATENT DOCUMENTS

CN          86206128 U   *   5/1987   ......... G01R 27/2605
CN         104049822 B   *   2/2017   ............. G06F 3/044
(Continued)

*Primary Examiner* — Hoai-An D. Nguyen
(74) *Attorney, Agent, or Firm* — Sughrue Mion, PLLC

(57) ABSTRACT

A circuit for detecting defects includes a defect detection conductor provided in a peripheral region of a semiconductor die, an input pad connected to a first end of the defect detection conductor, an output pad connected to a second end of the defect detection conductor, a defect detection assembly connected to the defect detection conductor and configured to detect a defect of the defect detection conductor, and a controller configured to control operations of the defect detection assembly, where the defect detection assembly includes a reference voltage supply, a reference capacitor, a switching assembly, and a plurality of detection capacitors, and the switching assembly is configured to connect the reference capacitor to one of the reference voltage supply, a position adjacent to the input pad of the defect detection conductor, and a position adjacent to the output pad of the defect detection conductor.

20 Claims, 14 Drawing Sheets

(58) Field of Classification Search
USPC .................................... 324/500, 537, 762.01
See application file for complete search history.

(56) References Cited

U.S. PATENT DOCUMENTS

| | | | |
|---|---|---|---|
| 10,788,528 B2 | 9/2020 | Kwon et al. | |
| 11,454,669 B2 | 9/2022 | Kumar et al. | |
| 11,555,863 B2 * | 1/2023 | Kawamura | ............ B60L 50/60 |
| 2021/0074596 A1 | 3/2021 | Kim et al. | |
| 2022/0082612 A1 | 3/2022 | Hu et al. | |
| 2025/0116561 A1 * | 4/2025 | Gautam | ................ G01L 9/0072 |

FOREIGN PATENT DOCUMENTS

| | | | | | |
|---|---|---|---|---|---|
| CN | 105974202 B | * | 6/2019 | ......... | G01R 27/2605 |
| CN | 112816903 A | * | 5/2021 | ............ | G01R 31/52 |
| JP | 3574370 B2 | * | 10/2004 | ............ | H04N 5/335 |
| KR | 10-0586847 B1 | | 6/2006 | | |
| KR | 10-2021-0029396 A | | 3/2021 | | |

* cited by examiner

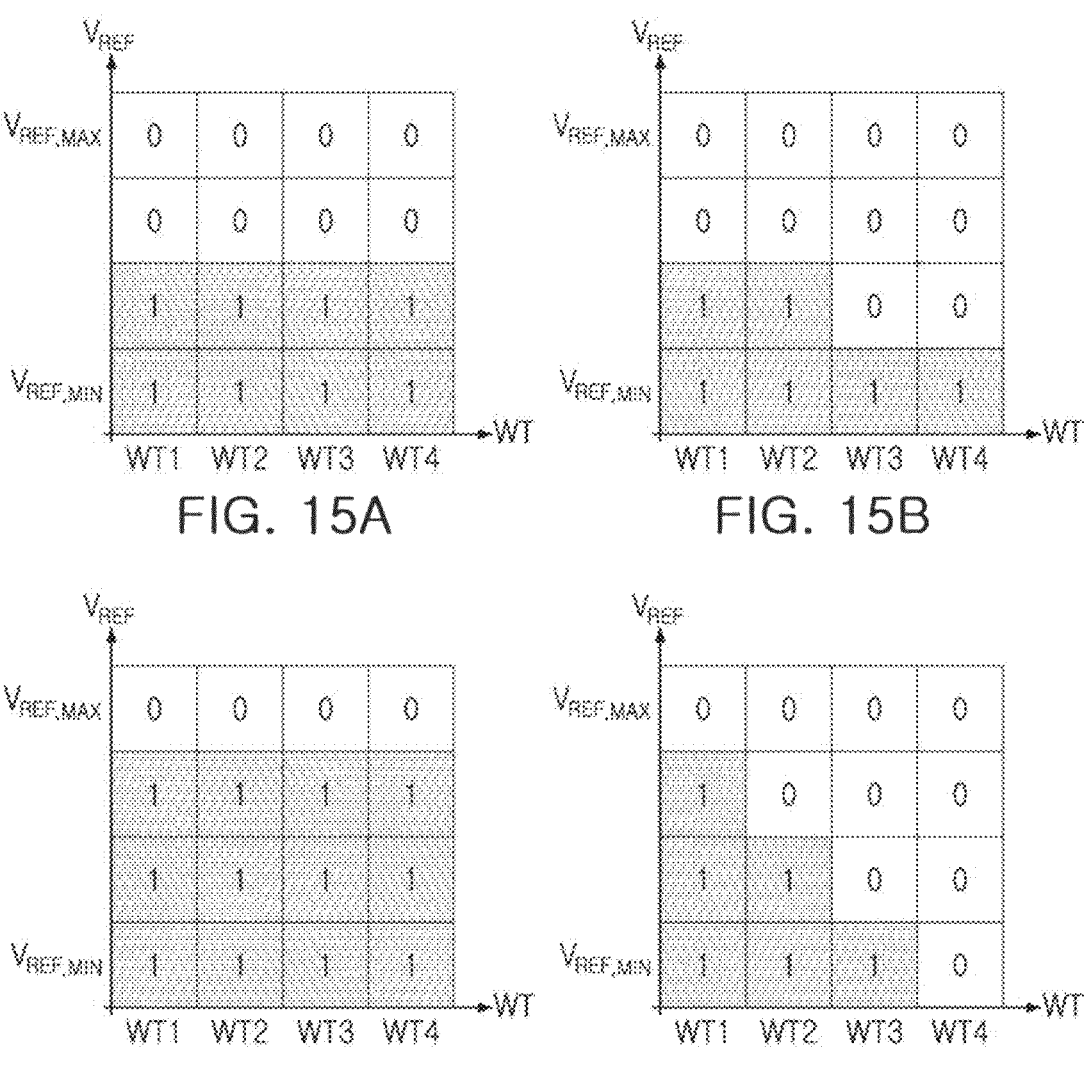
FIG. 15A          FIG. 15B
FIG. 15C          FIG. 15D
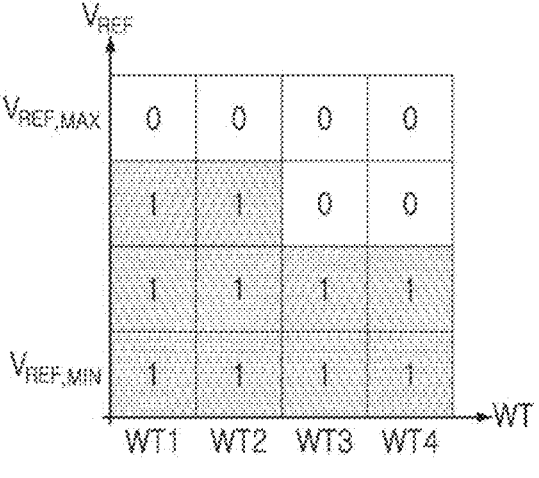
FIG. 15E

CIRCUIT FOR DETECTING DEFECTS

CROSS-REFERENCE TO RELATED APPLICATION

This application is based on and claims priority to Korean Patent Application No. 10-2023-0121920, filed on Sep. 13, 2023, in the Korean Intellectual Property Office, the disclosure of which is incorporated herein by reference in its entirety.

BACKGROUND

Example embodiments of the present disclosure relate to a circuit for detecting defects.

Once a semiconductor chip is manufactured on the wafer level, a packaging process is completed, and a semiconductor package is manufactured, a test process may be performed to test the product by intentionally exposing the semiconductor package to a target temperature or humidity. As a wafer goes through scribing, sawing, assembly, and testing processes, defects such as cracks may occur on the periphery of a semiconductor die or on a bonding pad. In this case, detecting defects in advance may be an important factor in maintaining reliability of the semiconductor package.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

One or more example embodiments provide a circuit for detecting defects that detects the presence and position of defects which may occur during a semiconductor process in which a semiconductor package is manufactured at a wafer level, thereby maintaining reliability of the semiconductor package.

Additional aspects will be set forth in part in the description which follows and, in part, will be apparent from the description, or may be learned by practice of the presented embodiments.

According to an aspect of an example embodiment, a circuit for detecting defects may include a defect detection conductor provided in a peripheral region of a semiconductor die, an input pad connected to a first end of the defect detection conductor, an output pad connected to a second end of the defect detection conductor, a defect detection assembly connected to the defect detection conductor and configured to detect a defect of the defect detection conductor, and a controller configured to control operations of the defect detection assembly, where the defect detection assembly includes a reference voltage supply, a reference capacitor, a switching assembly, and a plurality of detection capacitors, the switching assembly is configured to connect the reference capacitor to one of the reference voltage supply, a position adjacent to the input pad of the defect detection conductor, and a position adjacent to the output pad of the defect detection conductor, and the plurality of detection capacitors are connected between the input pad and the output pad in parallel.

According to an aspect of an example embodiment, a circuit for detecting defects may include a semiconductor die including a first region and a second region, a first defect detection conductor provided in a peripheral region of the first region, a second defect detection conductor provided in a peripheral region of the second region, an input pad connected to a first end of the first defect detection conductor and a first end of the second defect detection conductor, an output pad connected to a second end of the first defect detection conductor and a second end of the second defect detection conductor, a first defect detection assembly connected to the first defect detection conductor and configured to detect a defect of the first defect detection conductor, a second defect detection assembly connected to the second defect detection conductor and configured to detect a defect of the second defect detection conductor, and a controller configured to control the first defect detection assembly and the second defect detection assembly, where the first defect detection assembly includes a first reference voltage supply, a first reference capacitor, a first switching assembly, and a plurality of first detection capacitors, the first switching assembly is configured to connect the first reference capacitor to one of the first reference voltage supply, a position adjacent to the input pad of the first defect detection conductor, and a position adjacent to the output pad of the first defect detection conductor, the second defect detection assembly includes a second reference voltage supply, a second reference capacitor, a second switching assembly, and a plurality of second detection capacitors, and the second switching assembly is configured to connect the second reference capacitor to one of the second reference voltage supply, a position adjacent to the output pad of the second defect detection conductor, and a position adjacent to the output pad of the second defect detection conductor.

According to an aspect of an example embodiment, a circuit for detecting defects may include a defect detection conductor provided on a peripheral region of a semiconductor die, an input pad connected to a first end of the defect detection conductor, an output pad connected to a second end of the defect detection conductor, a defect detection assembly connected to the defect detection conductor and configured to detect a defect of the defect detection conductor, and a controller configured to control operations of the defect detection assembly, where the defect detection assembly includes a reference voltage supply, a reference capacitor, a switching assembly, a plurality of detection capacitors are connected to the defect detection conductor in parallel, the switching assembly includes a first switch configured to connect the reference capacitor to the reference voltage supply and a second switch configured to connect the reference capacitor to a position adjacent to the input pad of the defect detection conductor, based on the first switch being turned on and the second switch being turned off, the controller is configured to control the reference voltage supply to charge the reference capacitor, and based on the first switch being turned off and the second switch being turned on, the controller is configured to measure a voltage between the reference capacitor and at least one of the plurality of detection capacitors.

BRIEF DESCRIPTION OF DRAWINGS

The above and other aspects, features, and advantages of certain example embodiments of the present disclosure will be more apparent from the following description taken in conjunction with the accompanying drawings, in which:

FIGS. 15A to 15E are diagrams illustrating results of a system for detecting defects according to one or more example embodiments of the present disclosure.

DETAILED DESCRIPTION

Figure 1:
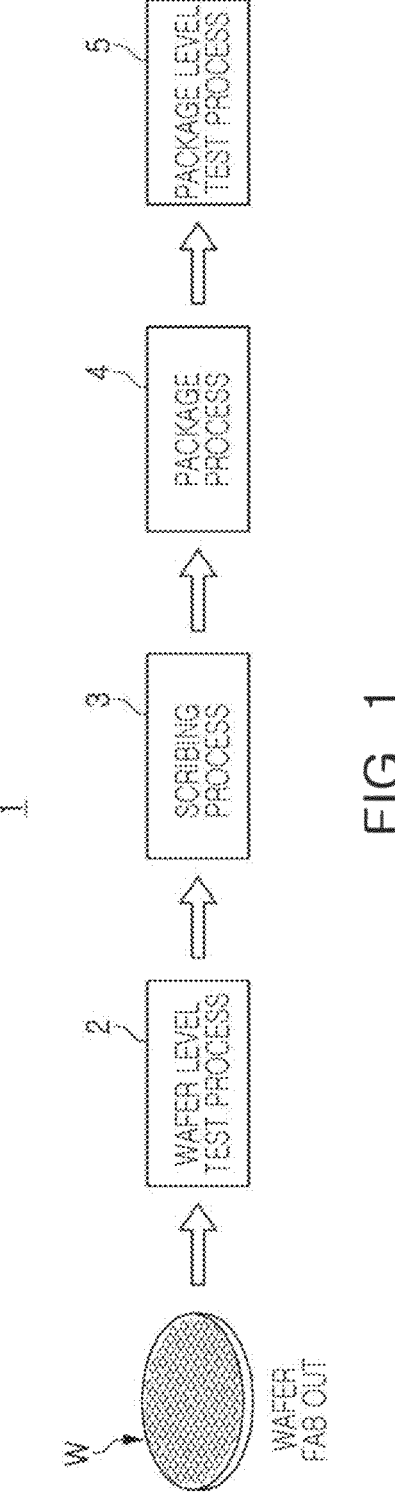
FIG. 1 is a diagram illustrating a process of manufacturing a semiconductor device according to one or more example embodiments of the present disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to"

or "directly coupled to" another element or layer, there are no intervening elements or layers present.

FIG. 1 is a diagram illustrating a process of manufacturing a semiconductor device according to one or more example embodiments of the present disclosure.

Referring to FIG. 1, a process of manufacturing a semiconductor device 1 according to one or more example embodiments may start with manufacturing a plurality of semiconductor chips on a wafer W. For example, the plurality of semiconductor chips manufactured by a wafer W may provide a semiconductor device such as a system-on-chip (SOC), an application processor (AP), a graphics processing unit (GPU), and a memory device.

When the wafer W is fab-out, a test process 2 may be performed on the wafer W at a wafer level. Once the test process 2 is completed on the wafer level, a scribing process 3 may be performed on the wafer W to obtain a plurality of semiconductor chips.

Thereafter, by performing a package process 4 on the semiconductor chips, a plurality of semiconductor packages may be obtained. The plurality of semiconductor packages may be manufactured by a process of mounting at least one semiconductor chip on a package substrate, and a process of connecting the package substrate and the semiconductor chip using a wire.

When the package process 4 is completed and the plurality of semiconductor packages are manufactured, a test process 5 may be performed on the plurality of semiconductor packages. In the test process 5 on the package level, in addition to a process of identifying whether a normal operation is performed by applying an electrical signal, a test process of applying stress to the semiconductor package by applying a high voltage to the semiconductor package or exposing the semiconductor package to a test environment of target temperature or target humidity to initially eliminate potential defects in the semiconductor package may be performed.

External stimuli such as high temperature, high pressure, and high humidity may be applied to the semiconductor chip while going through a series of processes, and accordingly, defects may occur in the semiconductor chip. For example, cracks may occur in the periphery of the semiconductor chip, or cracks may occur in the coupling portion between the cell region and the peripheral circuit region of the semiconductor chip. Accordingly, an operation of maintaining reliability of the semiconductor chip by detecting defects in the semiconductor chip in advance may be performed.

Figure 2:
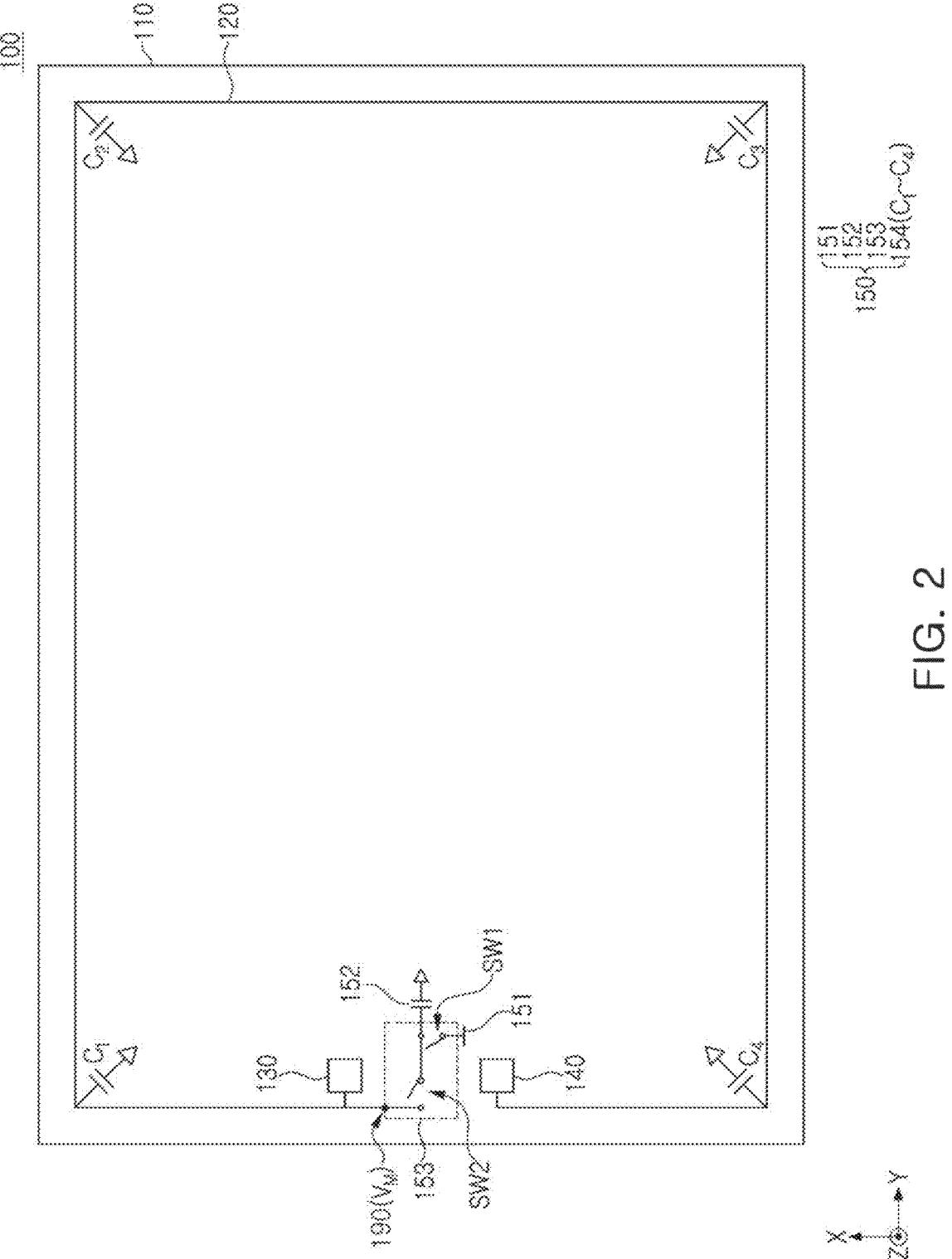
FIGS. 2 and 3 are diagrams illustrating a semiconductor device including a circuit for detecting defects according to one or more example embodiments of the present disclosure.
Figure 3:
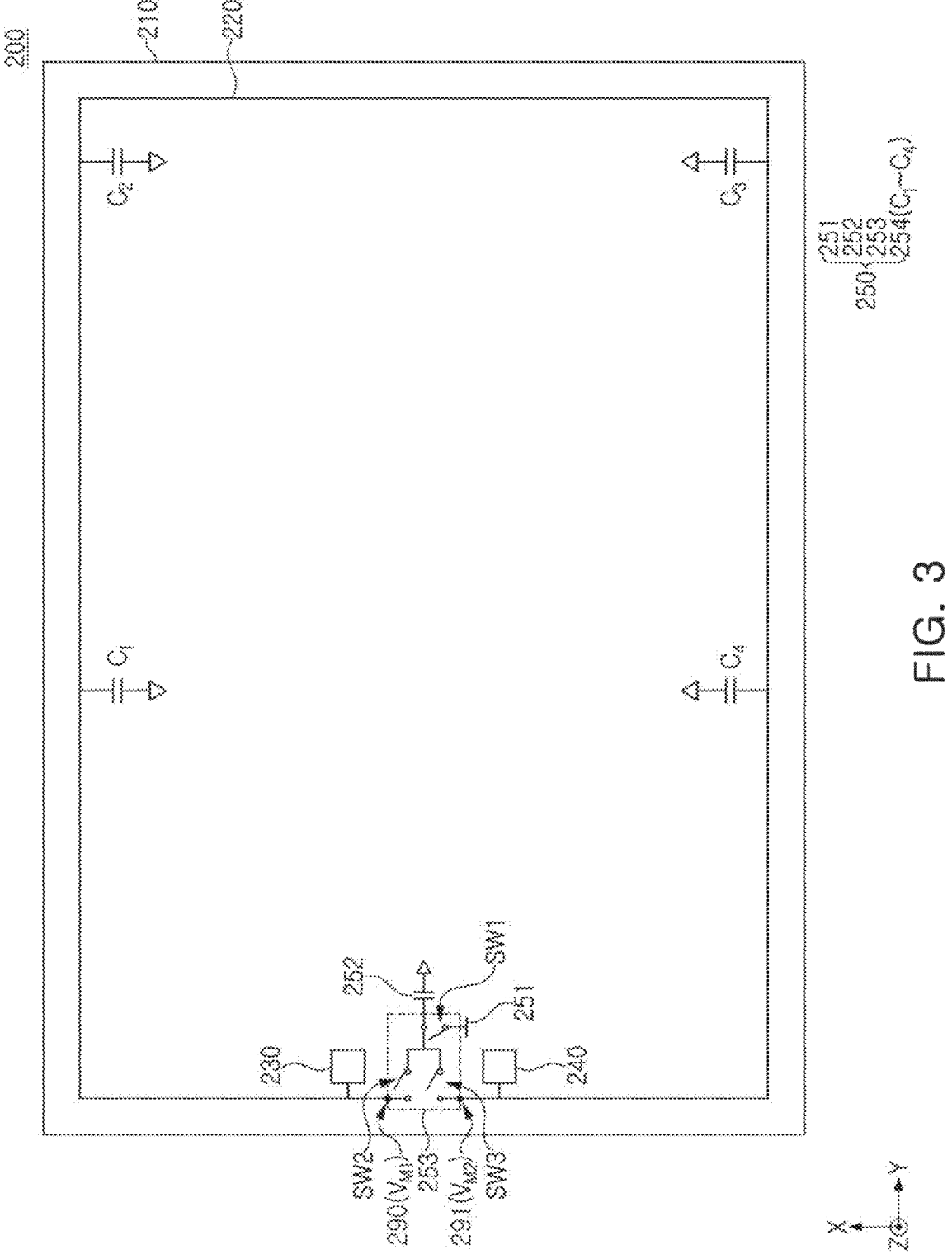

FIGS. 2 and 3 are diagrams illustrating a semiconductor device including a circuit for detecting defects according to one or more example embodiments of the present disclosure.

First, referring to FIG. 2, a semiconductor device 100 according to one or more example embodiments may include a semiconductor die 110 and a circuit for detecting defects. The circuit for detecting defects may include a defect detection conductor 120, an input pad 130, an output pad 140, and a defect detection assembly 150.

According to one or more example embodiments, the defect detection conductor 120 may be disposed on the peripheral region of the semiconductor die 110. The input pad 130 and the output pad 140 may be disposed on the same surface of the semiconductor die 110, and the input pad 130 and the output pad 140 may be disposed in the first direction (the X-axis direction in FIG. 2) at a distance. The input pad 130 may be connected to one end of the defect detection conductor 120, and the output pad 140 may be connected to the other end of the defect detection conductor 120. The input pad 130 and the output pad 140 may be connected to a logic circuit of the semiconductor device, but the input pad 130 and the output pad 140 may be separated from the logic circuit while the circuit for detecting defects is driven.

The defect detection assembly 150 may include a reference voltage supply 151, a reference capacitor 152, a switching assembly 153, and a plurality of detection capacitors 154. The defect detection assembly 150 may be connected to the defect detection conductor 120 and may detect defects of the defect detection conductor 120. Operations of the defect detection assembly 150 may be controlled by a controller.

The switching assembly 153 may be disposed between the input pad 130 and the output pad 140, and the switching assembly 153 may connect the reference capacitor 152 to one or more of the reference voltage supply 151 and a position adjacent to the input pad 130 of defect detection conductor 120. According to one or more example embodiments, the switching assembly 153 may include a first switch SW1 connecting the reference capacitor 152 to the reference voltage supply 151, and a second switch SW2 connecting the reference capacitor 152 to a position adjacent to the input pad 130 of the defect detection conductor 120. For example, the switching assembly 153 may have one of a first state in which the first switch SW1 is turned on and the second switch SW2 is turned off, a second state in which the second switch SW2 is turned on and the first switch SW1 is turned off, and a third state in which the first switch SW1 and the second switch SW2 are turned off.

According to one or more example embodiments, a plurality of detection capacitors 154 may be connected in parallel between the input pad 130 and the output pad 140. For example, the plurality of detection capacitors 154 may include the first to fourth detection capacitors C1-C4. As illustrated in FIG. 2, each of the plurality of detection capacitors 154 may be disposed at vertices of the semiconductor die 110. The plurality of detection capacitors 154 may have different capacitance values. Also, as an example, a sum of capacitance values of the plurality of detection capacitors 154 may be equal to or approximate to a capacitance value of the reference capacitor 152.

When cracks occur in the periphery of the semiconductor die 110, the defect detection conductor 120 may be disconnected due to the cracks. Depending on disconnected positions, capacitor composite values of the plurality of detection capacitors 154 may be different. For example, when the defect detection conductor 120 is disconnected between the first detection capacitor C1 and the second detection capacitor C2, the capacitor composite values of the plurality of detection capacitors 154 may be equal to or approximate to a capacitance value of the first detection capacitor C1. For example, when the defect detection conductor 120 is disconnected between the third detection capacitor C3 and the fourth detection capacitor C4, the capacitor composite values of the plurality of detection capacitors may be equal to or approximate to a sum of capacitance values of the first to third detection capacitors C1-C3.

In the first state of the switching assembly 153, the reference capacitor 152 may be charged by the reference voltage supply 151. Thereafter, in the second state in which the switching assembly 153 has passed through the third state, the controller may control the defect detection assembly 150 to measure a measurement voltage $V_M$ at a node 190 at which the switching assembly 153 is connected to the defect detection conductor 120.

According to one or more example embodiments, the capacitor composite values of the plurality of detection capacitors 154 may be determined depending on a position at which the defect detection conductor 120 is disconnected, and accordingly, the measurement voltage $V_M$ may be determined. The controller may supply a reference voltage through the reference voltage supply 151. In other words, by comparing the measurement voltage $V_M$ and the reference voltage, whether the defect detection conductor 120 is disconnected and the disconnection position may be detected.

Referring to FIG. 3, a semiconductor device 200 according to one or more example embodiments may include a semiconductor die 210 and a circuit for detecting defects. The circuit for detecting defects may include a defect detection conductor 220, an input pad 230, an output pad 240, and a defect detection assembly 250. The defect detection assembly 250 may include a reference voltage supply 251, a reference capacitor 252, a switching assembly 253, and a plurality of detection capacitors 254.

As compared to the semiconductor device 100 in FIG. 2, in the semiconductor device 200 in FIG. 3, the plurality of detection capacitors and the switching assembly may be configured differently, and specific example embodiments may be similar to the examples described with reference to FIG. 2.

For example, according to one or more example embodiments, the plurality of detection capacitors 254 may include first to fourth detection capacitors C1-C4, and the plurality of detection capacitors 254 may be disposed at the same distance from each other.

The switching assembly 253 may connect the reference capacitor 252 to one or more of the reference voltage supply 251, a position adjacent to the input pad 230 of the defect detection conductor 220, and a position adjacent to the output pad 240 of the defect detection conductor 220. According to one or more example embodiments, the switching assembly 253 may include a first switch SW1 connecting the reference capacitor 252 to the reference voltage supply 251, a second switch SW2 connecting the reference capacitor 252 to the position adjacent to the input pad 230 of the defect detection conductor 220, and a third switch SW3 connecting the reference capacitor 252 to a position adjacent to the output pad 240 of the defect detection conductor 220. As compared to the switching assembly 153 in FIG. 2, the switching assembly 253 in FIG. 3 may further include the third switch SW3.

For example, the switching assembly 253 may have one of a first state in which the first switch SW1 is turned on and the second switch SW2 and the third switch SW3 are turned off, a second state in which the second switch SW2 is turned on and the first switch SW1 and the third switch SW3 are turned off, a third state in which the third switch SW3 is turned on and the first switch SW1 and the second switch SW2 are turned off, and a fourth state in which the first to third switches SW1-SW3 are turned off.

In the first state of the switching assembly 253, the reference capacitor 252 may be charged by the reference voltage supply 251. Thereafter, in the second and third states after the switching assembly 253 goes through the fourth state, the controller may control the defect detection assembly 250 to measure a measurement voltage $V_M$ at a node at which the switching assembly 253 is connected to the defect detection conductor 220. Specifically, in the second state of the switching assembly 253, the controller may control the defect detection assembly 250 to measure the first measured voltage $V_{M1}$ at a node 290 at which the second switch SW2 is connected to the defect detection conductor 220. In the third state of the switching assembly 253, the controller may control the defect detection assembly 250 to measure the second measured voltage $V_{M2}$ at a node 291 at which the third switch SW3 is connected to the defect detection conductor 220.

As illustrated in FIG. 3, the defect detection assembly 250 may determine whether the defect detection conductor 220 is disconnected and the disconnection position from the input pad 230 in the second state, and may determine whether the defect detection conductor 220 is disconnected and the disconnection position from the output pad 240 in the third state. In other words, when the defect detection conductor 220 is disconnected in two positions, the defect detection assembly 250 may detect both disconnection positions, and accordingly, detecting accuracy may be improved as compared to the defect detection assembly 150 illustrated in FIG. 2.

Figure 4:
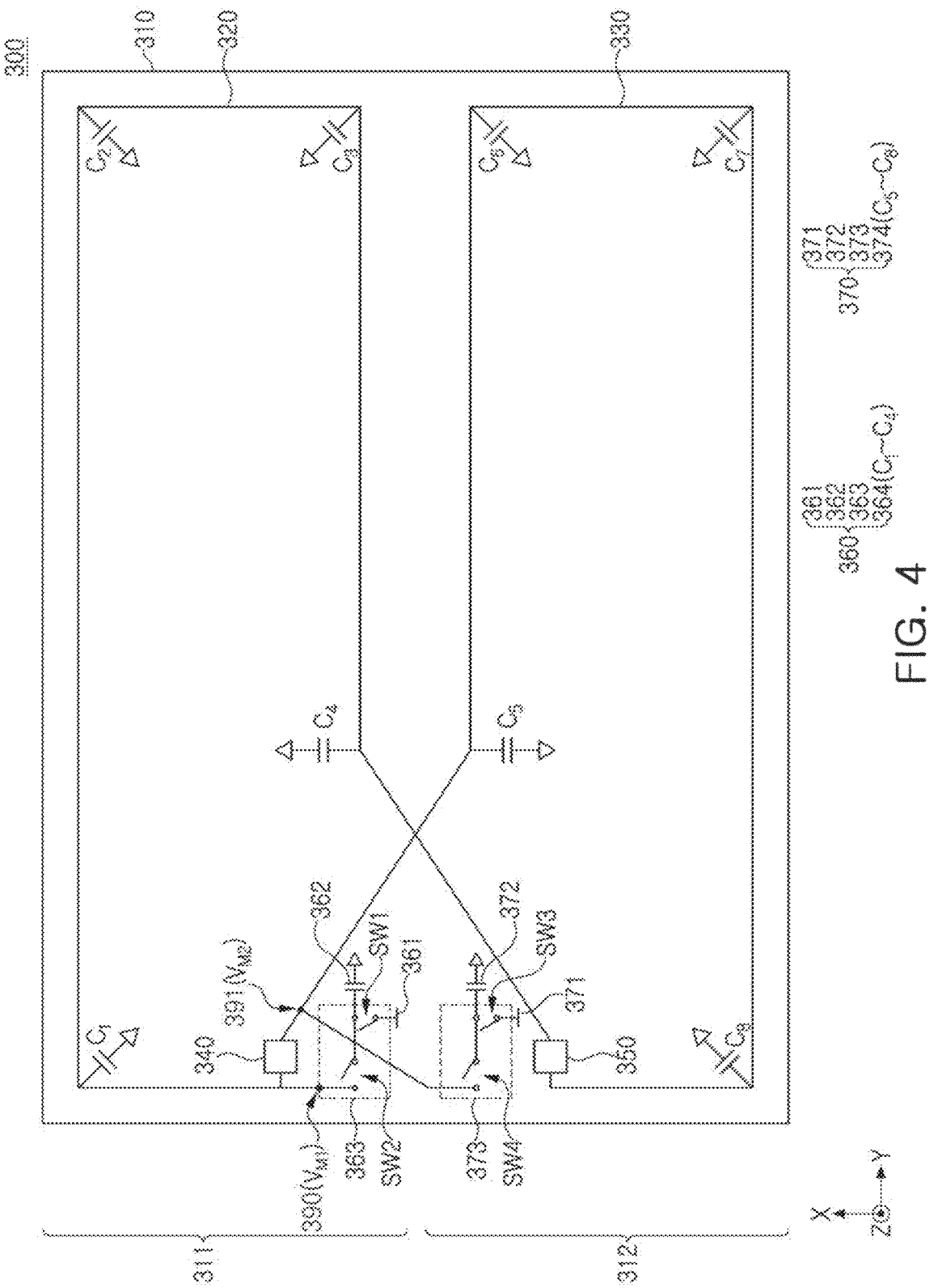
FIGS. 4 and 5 are diagrams illustrating a semiconductor device including a circuit for detecting defects according to one or more example embodiments of the present disclosure.
Figure 5:
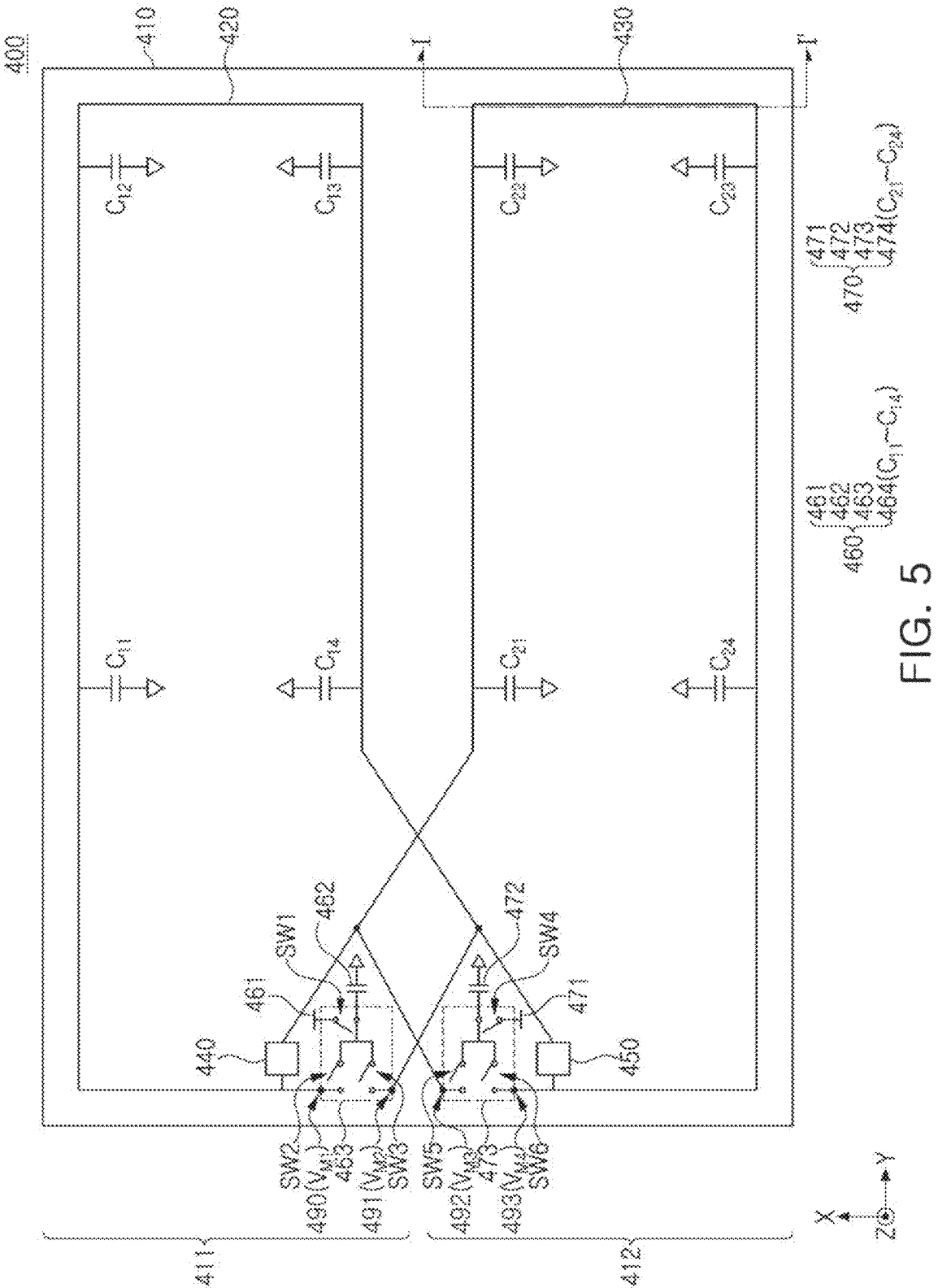

FIGS. 4 and 5 are diagrams illustrating a semiconductor device including a circuit for detecting defects according to one or more example embodiments of the present disclosure.

Referring to FIG. 4, a semiconductor device 300 according to one or more example embodiments may include a semiconductor die 310 and a circuit for detecting defects. The circuit for detecting defects may include a first defect detection conductor 320, a second defect detection conductor 330, an input pad 340, an output pad 350, a first defect detection assembly 360, and a second defect detection assembly 370.

According to one or more example embodiments, the semiconductor die 310 may be divided into a first region 311 and a second region 312. For example, the first region 311 and the second region 312 may extend in the first direction (the X-axis direction in FIG. 4) parallel to an upper surface of the semiconductor die 310, and may contact each other in a second direction parallel to an upper surface of the semiconductor die 310 and perpendicular to the first direction (the Y-axis direction in FIG. 4). However, the partition and differences between the first region 311 and the second region 312 are not limited to the above example. The first defect detection conductor 320 may be disposed in a peripheral region of the first region 311, and the second defect detection conductor 330 may be disposed on a peripheral region of the second region 312. The input pad 340 and the output pad 350 may be disposed on the same surface of the semiconductor die 310, and the input pad 340 and the output pad 350 may be disposed in the first direction (the X-axis direction in FIG. 4) at a distance. The input pad 340 may be connected to one end of the first defect detection conductor 320 and one end of the second defect detection conductor 330, and the output pad 350 may be connected to the other end of first defect detection conductor 320 and the other end of second defect detection conductor 330.

The first defect detection assembly 360 may include a first reference voltage supply 361, a first reference capacitor 362, a first switching assembly 363, and a plurality of first detection capacitors 364. The first defect detection assembly 360 may be connected to the first defect detection conductor 320 and may detect defects of the first defect detection conductor 320. Operations of the first defect detection assembly 360 may be controlled by a controller.

The first switching assembly 363 may connect the first reference capacitor 362 to one or more of the first reference voltage supply 361 and a position adjacent to the input pad 340 of the first defect detection conductor 320. According to one or more example embodiments illustrated in FIG. 4, the first switching assembly 363 may include a first switch SW1 connecting the first reference capacitor 362 to the first reference voltage supply 361, and a second switch SW2 connecting the first reference capacitor 362 to a position adjacent to the input pad 340 of the first defect detection conductor 320. For example, the first switching assembly 363 may have one of a first state in which the first switch SW1 is turned on and the second switch SW2 is turned off, a second state in which the second switch SW2 is turned on and the first switch SW1 is turned off, and a third state in which the first switch SW1 and the second switch SW2 are turned off.

According to one or more example embodiments, the plurality of first detection capacitors 364 may be connected in parallel between the input pad 340 and the output pad 350. For example, the plurality of first detection capacitors 364 may include the first to fourth detection capacitors C1-C4. As illustrated in FIG. 4, the plurality of first detection capacitors 364 may be disposed on vertices of the first region 311 of the semiconductor die 310. The plurality of first detection capacitors 364 may have different capacitance values. Also, as an example, a sum of capacitance values of the plurality of first detection capacitors 364 may be equal to or approximate to a capacitance value of the first reference capacitor 362.

When cracks occur in the periphery of the first region 311 of the semiconductor die 310, the first defect detection conductor 320 may be disconnected due to the cracks. Depending on disconnected positions, capacitor composite values of the first detection capacitors 364 may be different. For example, when the first defect detection conductor 320 is disconnected between the first detection capacitor C1 and the second detection capacitor C2, capacitor composite values of the plurality of first detection capacitors 364 may be equal to or approximate to a capacitance value of the first detection capacitor C1. For example, when the first defect detection conductor 320 is disconnected between the third detection capacitor C3 and the fourth detection capacitor C4, capacitor composite values of the plurality of first detection capacitors 364 may be equal to or close to a sum of capacitance values of the first to third detection capacitors C1-C3.

As illustrated in FIG. 4, in the first state of the first switching assembly 363, the first reference capacitor 362 may be charged by the first reference voltage supply 361. Thereafter, in the second state after the first switching assembly 363 goes through the third state, the controller may control the first defect detection assembly 360 to measure a first measured voltage $V_{M1}$ at a node 390 at which the first switching assembly 363 is connected to the first defect detection conductor 320.

The second defect detection assembly 370 may include a second reference voltage supply 371, a second reference capacitor 372, a second switching assembly 373, and a plurality of second detection capacitors 374. The second defect detection assembly 370 may be connected to the second defect detection conductor 330 and may detect defects of the second defect detection conductor 330. Operations of the second defect detection assembly 370 may be controlled by a controller.

The second switching assembly 373 may connect the second reference capacitor 372 to one or more of the second reference voltage supply 371 and a position adjacent to the input pad 340 of the second defect detection conductor 330. According to one or more example embodiments, the second switching assembly 373 may include a third switch SW3 connecting the second reference capacitor 372 to the second reference voltage supply 371, and a fourth switch SW4 connecting the second reference capacitor 372 to a position adjacent to the input pad 340 of the second defect detection conductor 330. For example, the second switching assembly

373 may have a fourth state in which the third switch SW3 is turned on and the fourth switch SW4 is turned off, a fifth state in which the fourth switch SW4 is turned on and the third switch SW3 is turned off, and a sixth state in which the third switch SW3 and the fourth switch SW4 are turned off.

According to one or more example embodiments, the plurality of second detection capacitors 374 may be connected in parallel between the input pad 340 and the output pad 350. As an example, the plurality of second detection capacitors 374 may include fifth to eighth detection capacitors C5-C8. As illustrated in FIG. 4, the plurality of second detection capacitors 374 may be disposed at vertices of a second region 312 of the semiconductor die 310. The plurality of second detection capacitors 374 may have different capacitance values. Also, as an example, a sum of capacitance values of the plurality of second detection capacitors 374 may be equal to or approximate to a capacitance value of the second reference capacitor 372.

When cracks occur in the periphery of the second region 312 of the semiconductor die 310, the second defect detection conductor 330 may be disconnected due to the cracks. Depending on the disconnected position, capacitor composite values of the second detection capacitors 374 may be different. For example, when the second defect detection conductor 330 is disconnected between the fifth detection capacitor C5 and the sixth detection capacitor C6, capacitor composite values of the plurality of second detection capacitors 374 may be equal to or approximate to a capacitance value of the fifth detection capacitor C5. For example, when the second defect detection conductor 330 is disconnected between the seventh detection capacitor C7 and the eighth detection capacitor C8, capacitor composite values of the plurality of second detection capacitors 374 may be equal to or close to a sum of capacitance values of the fifth to seventh detection capacitors C5-C7.

As illustrated in FIG. 4, in the fourth state of the second switching assembly 373, the second reference capacitor 372 may be charged by the second reference voltage supply 371. Thereafter, in the fifth state after the second switching assembly 373 has passed through the sixth state, the controller may control the second defect detection assembly 370 to measure a second measured voltage $V_{M2}$ at a node 391 at which the second switching assembly 373 is connected to the second defect detection conductor 330.

A magnitude of voltage supplied by the first reference voltage supply 361 may be equal to or different from a magnitude of voltage supplied by the second reference voltage supply 371. A capacitance value of the first reference capacitor 362 may be equal to or different from a capacitance value of second reference capacitor 372. Also, capacitance values of the plurality of first detection capacitors 364 may be equal to or different from capacitance values of the plurality of second detection capacitors 374, respectively. The first and second defect detection assemblies 360 and 370 may operate simultaneously, and only one of the first and second defect detection assemblies 360 and 370 may operate.

According to one or more example embodiments, capacitor composite values of the plurality of first and second detection capacitors 364 and 374 may be determined depending on a position in which each of the first and second defect detection conductors 320 and 330 is disconnected, and accordingly, first and second measured voltages $V_{M1}$ and $V_{M2}$ may be determined. The controller may supply a first reference voltage through the first reference voltage supply 361 and a second reference voltage through the second reference voltage supply 371. In other words, by comparing the first measured voltage $V_{M1}$ and the first reference voltage, whether the first defect detection conductor 320 is disconnected and a disconnection position may be detected. By comparing the second measured voltage $V_{M2}$ and the second reference voltage, whether the second defect detection conductor 330 is disconnected and a disconnection position may be detected.

As compared to the semiconductor device 100 in FIG. 2, in the semiconductor device 300 in FIG. 4, the second defect detection conductor 330 and the second defect detection assembly 370 may be configured differently. The circuit for detecting defects of the semiconductor device 100 according to one or more example embodiments in FIG. 2 may detect defects in the periphery of the semiconductor die 110, and the circuit for detecting defects may detect defects in the periphery of the semiconductor die 310 and in the region in which the first region 311 and the second region 312 contact each other. Differently from the example embodiment illustrated in FIG. 4, the semiconductor device 300 may not include at least one of the fourth detection capacitor C4 and the fifth detection capacitor C5.

As illustrated in FIG. 4, the first defect detection assembly 360 may determine whether the defect detection conductor 320 is disconnected and a disconnection position from the input pad 340 in the second state, and the second defect detection assembly 370 may determine whether the defect detection conductor 330 is disconnected and a disconnection position from the input pad 340 in the fifth state. In other words, when each of the first and second defect detection conductors 320 and 330 is disconnected in one position, the first defect detection assembly 360 may detect a disconnection position of the first defect detection conductor 320, and the second defect detection assembly 370 may detect a disconnection position of the second defect detection conductor 330. Accordingly, accuracy of detecting defects of the semiconductor device 300 in FIG. 4 may be improved as compared to that of the semiconductor device 100 in FIG. 2.

Referring to FIG. 5, a semiconductor device 400 according to one or more example embodiments may include a semiconductor die 410 and a circuit for detecting defects. The circuit for detecting defects may include a first defect detection conductor 420, a second defect detection conductor 430, an input pad 440, an output pad 450, a first defect detection assembly 460, and a second defect detection assembly 470. The first defect detection assembly 460 may include a first reference voltage supply 461, a first reference capacitor 462, a first switching assembly 463, and a plurality of first detection capacitors 464. The second defect detection assembly 470 may include a second reference voltage supply 471, a second reference capacitor 472, a second switching assembly 473, and a plurality of second detection capacitors 474.

As compared to the semiconductor device 300 in FIG. 4, in the semiconductor device 400 in FIG. 5, the arrangement of the plurality of first and second detection capacitors 464 and 474 and the configuration of the first and second switching assemblies 463 and 473 may be different, and specific example embodiments may be similar to the examples described with reference to FIG. 4.

According to one or more example embodiments, the plurality of first detection capacitors 464 may include first to fourth detection capacitors C11-C14, and the plurality of second detection capacitors 474 may include fifth to eighth detection capacitors C21-C24. For example, the plurality of first and second detection capacitors 464 and 474 may be disposed at the same distance from each other.

The first switching assembly 463 may connect the first reference capacitor 462 to one or more of the first reference voltage supply 461, a position adjacent to the input pad 440 of the first defect detection conductor 420, and a position adjacent to the output pad 450 of the first defect detection conductor 420. According to one or more example embodiments, the first switching assembly 463 may include a first switch SW1 connecting the first reference capacitor 462 to the first reference voltage supply 461, a second switch SW2 connecting the first reference capacitor 462 to a position adjacent to the input pad 440 of the first defect detection conductor 420, and a third switch SW3 connecting the first reference capacitor 462 to a position adjacent to the output pad 450 of the first defect detection conductor 420.

The second switching assembly 473 may connect the second reference capacitor 472 to one or more of the second reference voltage supply 421, a position adjacent to the input pad 440 of the second defect detection conductor 430, and a position adjacent to the output pad 450 of the second defect detection conductor 430. According to one or more example embodiments, the second switching assembly 473 may include a fourth switch SW4 connecting the second reference capacitor 472 to the second reference voltage supply 471, a fifth switch SW5 connecting the second reference capacitor 472 to a position adjacent to the input pad 440 of the second defect detection conductor 430, and a sixth switch SW6 connecting the second reference capacitor 472 to a position adjacent to the output pad 450 of the second defect detection conductor 430.

For example, the first switching assembly 463 may have a first state in which the first switch SW1 is turned on and the second switch SW2 and the third switch SW3 are turned off, a second state in which the second switch SW2 is turned on and the first switch SW1 and the third switch SW3 are turned off, a third state in which the third switch SW3 is turned on and the first switch SW1 and the second switch SW2 are turned off, and a fourth state in which the first to third switches SW1-SW3 are turned off. The second switching assembly 473 may have a fifth state in which the fourth switch SW4 is turned on and the fifth switch SW5 and the sixth switch SW6 are turned off, a sixth state in which the fifth switch SW5 is turned on and the fourth switch SW4 and the sixth switch SW6 are turned off, a seventh state in which the sixth switch SW6 is turned on and the fourth switch SW4 and the fifth switch SW5 are turned off, and an eighth state in which the fourth sixth switches SW4-SW6 are turned off.

Specifically, in the second state of the first switching assembly 463, the controller may control the first defect detection assembly 460 to measure a first measured voltage $V_{M1}$ at a node 490 at which the second switch SW2 is connected to the first defect detection conductor 420. In the third state of the first switching assembly 463, the controller may control the first defect detection assembly 460 to measure a second measured voltage $V_{M2}$ at a node 491 at which the third switch SW3 is connected to the first defect detection conductor 420. Also, in the sixth state of the second switching assembly 473, the controller may control the second defect detection assembly 470 to measure a third measured voltage $V_{M3}$ at a node 492 at which the fifth switch SW5 is connected to the second defect detection conductor 430. In the seventh state of the second switching assembly 473, the controller may control the second defect detection assembly 470 to measure a fourth measured voltage $V_{M4}$ at a node 493 at which the sixth switch SW6 is connected to the second defect detection conductor 430.

As compared with the first and second switching assemblies 363 and 373 in FIG. 4, the first and second switching assemblies 463 and 473 in FIG. 5 may further include third and sixth switches SW3 and SW6. As illustrated in FIG. 5, the first and second defect detection assemblies 460 and 470 may determine whether the first and second defect detection conductors 420 and 430 are disconnected and disconnection positions from the input pad 440 in the second and sixth states, and whether the first and second defect detection conductors 420 and 430 are disconnected and the disconnection positions may be determined from the output pad 450 in the third and seventh states. In other words, when the first and second defect detection conductors 420 and 430 are disconnected in two positions, respectively, the first and second defect detection assemblies 460 and 470 may detect both the disconnection positions, such that detecting accuracy may be improved as compared to the first and second defect detection assemblies 360 and 370 illustrated in FIG. 4.

Figure 6A:
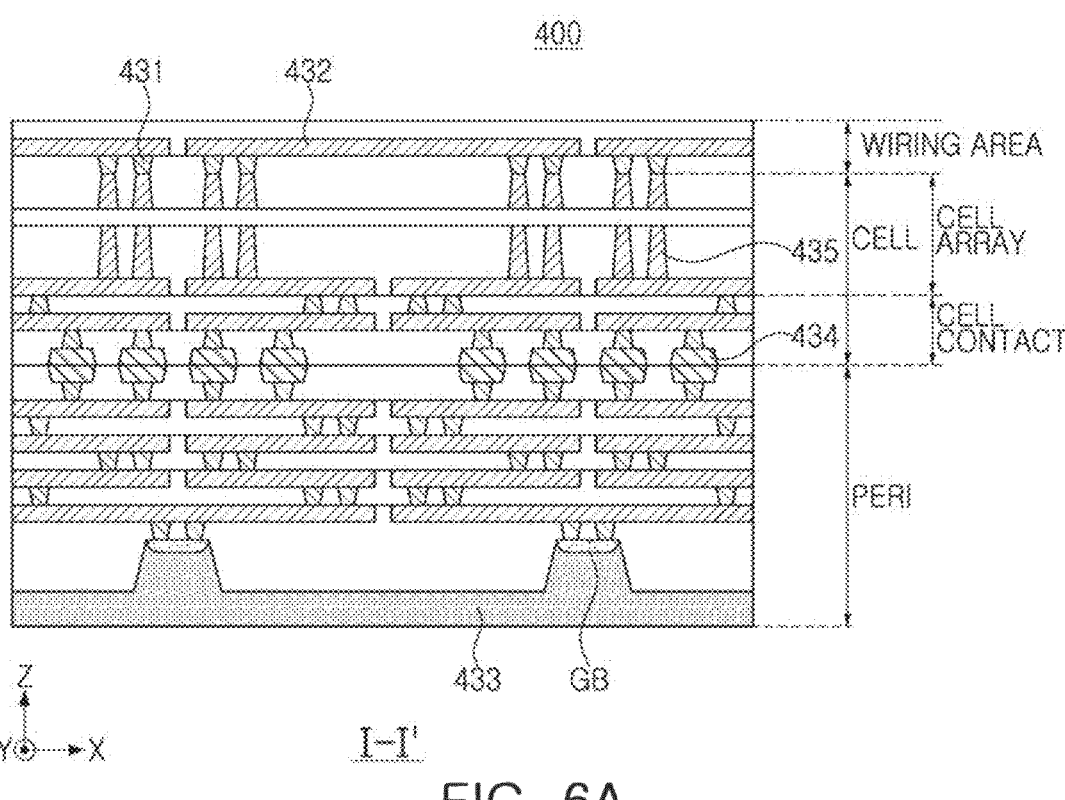
FIGS. 6A to 6C are diagrams illustrating cross-sections of a semiconductor device illustrated in FIG. 5 taken along line I-I' according to one or more example embodiments of the present disclosure.
Figure 6B:
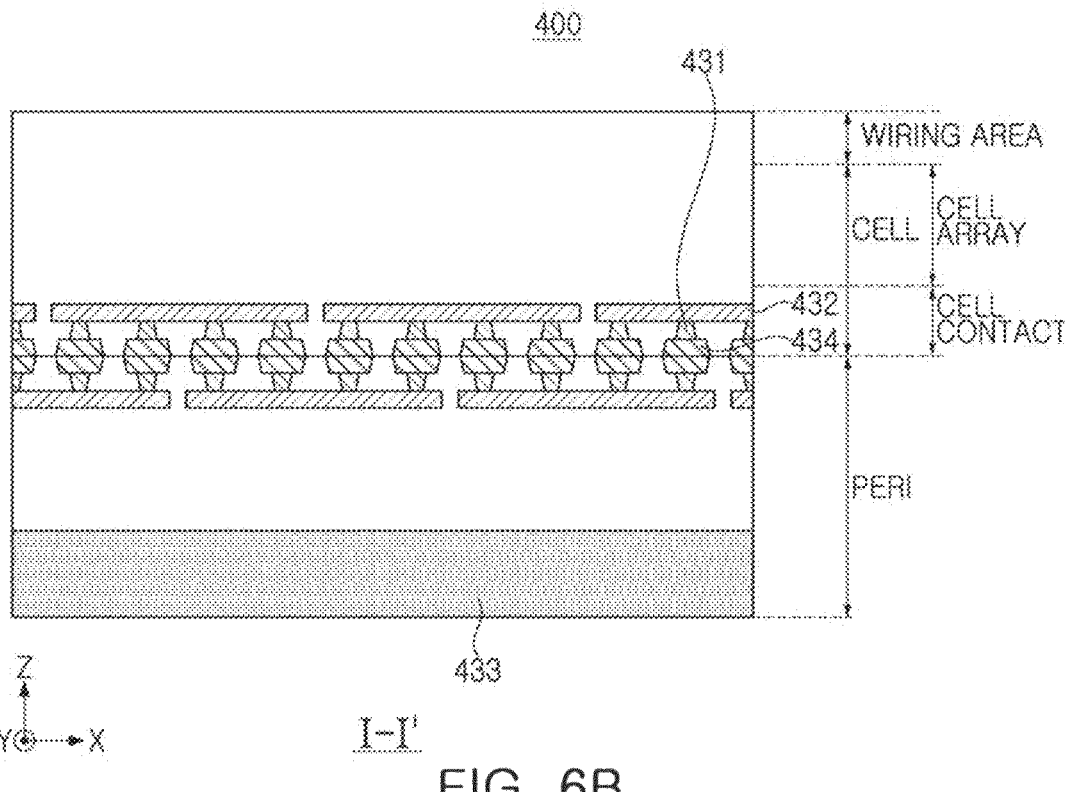
Figure 6C:
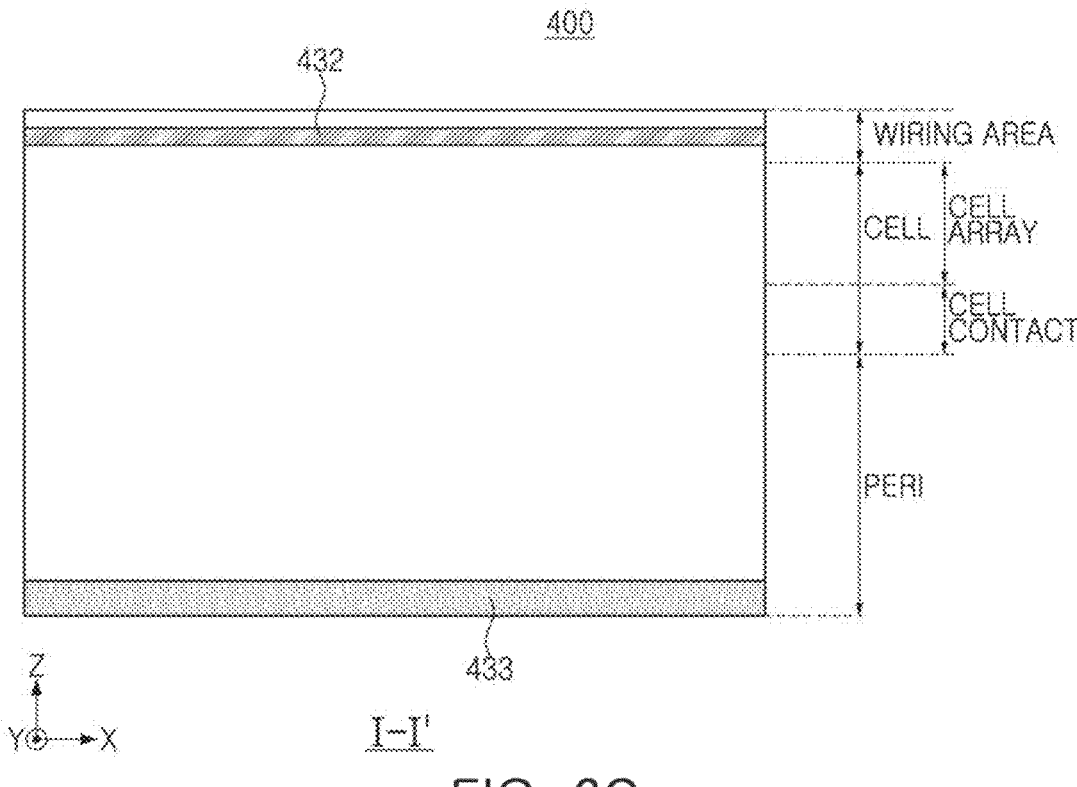

FIGS. 6A to 6C are diagrams illustrating cross-sections of a semiconductor device illustrated in FIG. 5 taken along line I-I' according to one or more example embodiments of the present disclosure.

Referring to FIGS. 6A to 6C, the semiconductor device 400 may be divided into an uppermost wiring region WIRING AREA, a cell region CELL, and a peripheral circuit region PERI, and the uppermost wiring region WIRING AREA, the cell region CELL, and the peripheral circuit region PERI may be stacked in the first direction (the Z-axis direction). The arrangement of the uppermost wiring region WIRING AREA, the cell region CELL, and the peripheral circuit region PERI is not limited thereto.

First, referring to FIG. 6A, the cell region CELL of the semiconductor device 400 may include a cell array region CELL ARRAY and a cell contact region CELL CONTACT. In example embodiments, the cell contact region CELL CONTACT may be stacked below the cell array region CELL ARRAY in the Z-axis direction. For example, in the cell array region CELL ARRAY, cell channel structures, wiring patterns 432 and cell contacts 435 may be disposed. For example, in the cell contact region CELL CONTACT, via patterns 431, the wiring patterns 432 and bonding pads 434 may be disposed. The peripheral circuit region PERI of the semiconductor device 400 may include a plurality of guard-band devices GB formed on the substrate 433, the via patterns 431 connected to the plurality of guard-band devices GB, and the wiring patterns 432.

In example embodiments, the uppermost wiring region WIRING AREA may be stacked on the cell array region CELL ARRAY in the Z-axis direction. In the uppermost wiring region WIRING AREA, at least one wiring pattern and the via patterns 431 may be disposed. Referring to FIG. 6A, the cell region CELL and the peripheral circuit region PERI may be bonded to each other through the bonding pads 434. As in example embodiments illustrated in FIG. 6A, each of the cell region CELL and the peripheral circuit region PERI may include a plurality of bonding pad pairs, each of which has two bonding pads 434 adjacent to each other and disposed at a distance from each other. However, the number of bonding pads included in each of the plurality of bonding pad pairs may not be limited thereto, and for example, the bonding pads may have one or three or more bonding pads.

For example, bonding pads 434 may be connected through the via patterns 431 and the wiring patterns 432. Also, according to one or more example embodiments, each of the plurality of bonding pad pairs included in the cell region CELL and the peripheral circuit region PERI may connect the wiring patterns 432 of the cell region CELL to the wiring patterns 432 of the peripheral circuit region PERI. The plurality of bonding pad pairs, the via patterns 431 and the wiring patterns 432 of the cell region CELL and the via patterns 431 and the wiring patterns 432 of the peripheral circuit region PERI may be provided as a second defect detection conductor 430.

When cracks occur in the semiconductor device 400, at least one of the via patterns 431, the wiring patterns 432 and the bonding pads 434 may be disconnected. In other words, referring to FIG. 5 as an example, the second defect detection conductor 430 may be disconnected. The controller may detect disconnection and a disconnection position of the second defect detection conductor 430 through the third or fourth measured voltage $V_{M3}$ and $V_{M4}$. Accordingly, reliability of the semiconductor device 400 may be improved by detecting defects in the via patterns 431, the wiring patterns 432, and/or the bonding pads 434 of the semiconductor device 400.

Thereafter, referring to FIG. 6B, the cell region CELL and the peripheral circuit region PERI of the semiconductor device 400 may be bonded to each other through the bonding pads 434. Each of the cell region CELL and the peripheral circuit region PERI may include a plurality of bonding pads 434 disposed at a distance from each other. However, the number of bonding pads included in each of the plurality of bonding pad pairs may not be limited thereto, and for example, the bonding pads may have one or three or more bonding pads.

Also, the bonding pads 434 may be connected through the via patterns 431 and the wiring patterns 432. For example, the wiring patterns 432 of the cell region CELL may be disposed to be shifted from the wiring patterns 432 of the peripheral circuit region PERI, and specifically, the wiring patterns 432 of the cell region CELL may be disposed to be shifted from the wiring patterns 432 of the peripheral circuit region PERI with respect to two adjacent bonding pads 434. The plurality of bonding pads 434, the via patterns 431 and the wiring patterns 432 of the cell region CELL and the via patterns 431 and the wiring patterns 432 of the peripheral circuit region PERI may be provided as a second defect detection conductor 430. Other specific example embodiments in FIG. 6B may be similar to FIG. 6A.

As illustrated in FIG. 6B, when cracks occur in the semiconductor device 400, at least one of the via patterns 431, the wiring patterns 432 and the bonding pads 434 may be disconnected. In other words, the second defect detection conductor 430 in example embodiments illustrated in FIG. 5 may be disconnected. The controller may detect disconnection and disconnection position of the second defect detection conductor 430 through the third or fourth measured voltage $V_{M3}$ and $V_{M4}$. Accordingly, reliability of the semiconductor device 400 may be improved by detecting defects and positions of defects in the via patterns 431, the wiring patterns 432, and/or the bonding pads 434 of the semiconductor device 400.

Thereafter, referring to FIG. 6C, the semiconductor device 400 may include a cell region CELL and a peripheral circuit region PERI. As compared to FIG. 6A, the semiconductor device 400 may be different in that the uppermost wiring region include one wiring pattern 432. For example, a wiring pattern 432 may be configured in the cell region CELL or the peripheral circuit region PERI. Other specific example embodiments in FIG. 6C may be similar to FIG. 6A.

As illustrated in FIG. 6C, when cracks occur in the semiconductor device 400, connection of the wiring pattern 432 may be disconnected. In other words, the second defect detection conductor 430 in example embodiments illustrated in FIG. 5 may be disconnected. The controller may detect disconnection and disconnection position of the second defect detection conductor 430 through the third or fourth measured voltage $V_{M3}$ and $V_{M4}$. Accordingly, as compared to the semiconductor device 400 illustrated in FIG. 6A, the semiconductor device 400 illustrated in FIG. 6C may detect defects and positions of defects in the entire period in which the wiring pattern 432 in the cell region CELL is disposed. In other words, accuracy of detecting defects in FIG. 6C may be relatively high.

Figure 7:
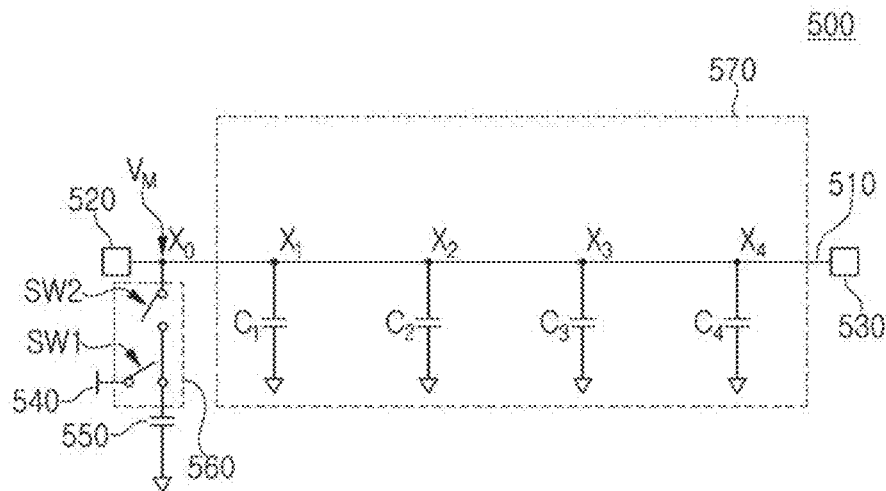
FIG. 7 is a diagram illustrating a circuit for detecting defects according to one or more example embodiments of the present disclosure.
Figure 8:
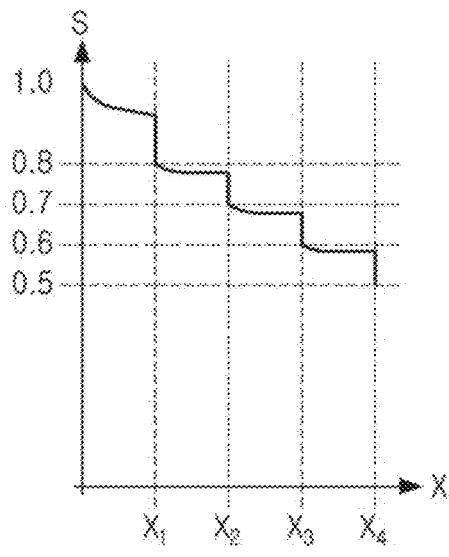
FIG. 8 is a diagram illustrating a ratio of measured voltage to reference voltage depending on a position of defects according to one or more example embodiments of the present disclosure.

FIG. 7 is a diagram illustrating a circuit for detecting defects according to one or more example embodiments of the present disclosure. FIG. 8 is a diagram illustrating a ratio of measured voltage to reference voltage depending on a position of defects according to one or more example embodiments of the present disclosure.

Referring to FIG. 7, the circuit 500 for detecting defects may include a defect detection conductor 510, an input pad 520, an output pad 530, and a defect detection assembly. The defect detection assembly may include a reference voltage supply 540, a reference capacitor 550, a switching assembly 560, and a plurality of detection capacitors 570.

The switching assembly 560 according to one or more example embodiments may be connected to a 0th position X0 of the defect detection conductor 510. The reference capacitor 550 may be connected to one or more of the reference voltage supply 540 and a position adjacent to the input pad 520 of the defect detection conductor 510. Specifically, the switching assembly 560 may include a first switch SW1 connecting the reference capacitor 550 to the reference voltage supply 540, and a second switch SW2 connecting the reference capacitor 550 to a position adjacent to the input pad 520 of the defect detection conductor 510.

The plurality of detection capacitors 570 according to one or more example embodiments may include first to fourth detection capacitors C1-C4. The first to fourth detection capacitors C1-C4 may be connected in parallel between the input pad 520 and the output pad 530.

The first detection capacitor C1 may be connected to the first position X1 of the defect detection conductor 510, the second detection capacitor C2 may be connected to the second position X2, the third detection capacitor C3 may be connected to the third position X3 of the defect detection conductor 510, and the fourth detection capacitor C4 may be connected to the fourth position X4 of the defect detection conductor 510. For example, as illustrated in FIG. 7, the first to fourth detection capacitors C1-C4 may be disposed and spaced apart at the same distance from each other. In other words, the first position X1 to the fourth position X4 may be disposed and spaced apart on the defect detection conductor 510 at the same distance from each other.

FIG. 8 is a diagram illustrating a ratio of measured voltage to reference voltage according to positions of defects according to one or more example embodiments illustrated in FIG. 7. Positions X of defects may correspond to the 0th position X0 to the fourth position X4 of the defect detection conductor 510. The measurement voltage $V_M$ may be measured at a node in the 0th position X0. The reference voltage may be supplied by the reference voltage supply 540 to the reference capacitor 550.

The reference capacitor 550 may be charged by turning on the first switch SW1 and connecting the reference capacitor 550 to the reference voltage supply 540. Thereafter, by turning off the first switch SW1 and turning on the second switch SW2, the reference capacitor 550 may be connected to the plurality of detection capacitors 570. In this case, capacitor composite values of the plurality of detection capacitors 570 may be different depending on the positions X of defects, and the measurement voltages $V_M$ may be different depending on the positions of defects.

For example, the first to fourth detection capacitors C1-C4 may have different capacitance values. Specifically, a sum of capacitance values of the first to fourth detection capacitors C1-C4 may be equal to a capacitance value of the reference capacitor 550. When the capacitance value of the reference capacitor 550 is $C_{STD}$, a capacitance value of the first detection capacitor C1 may be $$\frac{1}{4}C_{STD},$$

a capacitance value of the second detection capacitor C2 may be $$\frac{5}{28}C_{STD},$$

a capacitance value of the third detection capacitor C3 may be $$\frac{5}{21}C_{STD},$$

and a capacitance value of the fourth detection capacitor C4 may be $$\frac{1}{3}C_{STD}.$$

FIG. 8 may correspond to the example in which a capacitance value of each of the first to fourth detection capacitors C1-C4 may be sufficiently larger than a capacitance value of defect detection conductor 510. Also, FIG. 8 may also illustrate a ratio S of the measurement voltage $V_M$ to the reference voltage according to the positions X of defects.

For example, the ratio S of the measurement voltage $V_M$ to the reference voltage in each of the first to fourth positions X1-X4 may decrease by 0.1, but example embodiments thereof is not limited thereto. When the ratio S of the measurement voltage $V_M$ to the reference voltage is 0.7 or more and 0.8 or less, the controller may recognize that defects may be present in the defect detection conductor 510, and that the positions X of defects may be between the first position X1 and the second position X2. For example, when the ratio S of the measurement voltage $V_M$ to the reference voltage is 0.5 or more and 0.6 or less, the controller may recognize that defects may be present in the defect detection conductor 510, and the positions X of defects may be between the third position X3 and the fourth position X4. For example, when the ratio S of the measurement voltage $V_M$ to the reference voltage is less than 0.5, the controller may recognize that no defects are present in the defect detection conductor 510.

By designing the number of detection capacitors included in the plurality of detection capacitors 570 and a capacitance value of each detection capacitor, the number of defect testing positions of the defect detection conductor 510 and the amount by which the ratio S of the measurement voltage $V_M$ to the reference voltage decreases in each defect testing position may be adjusted. Accordingly, accuracy in detecting positions of defects may be improved through the measurement voltage $V_M$.

Figure 9:
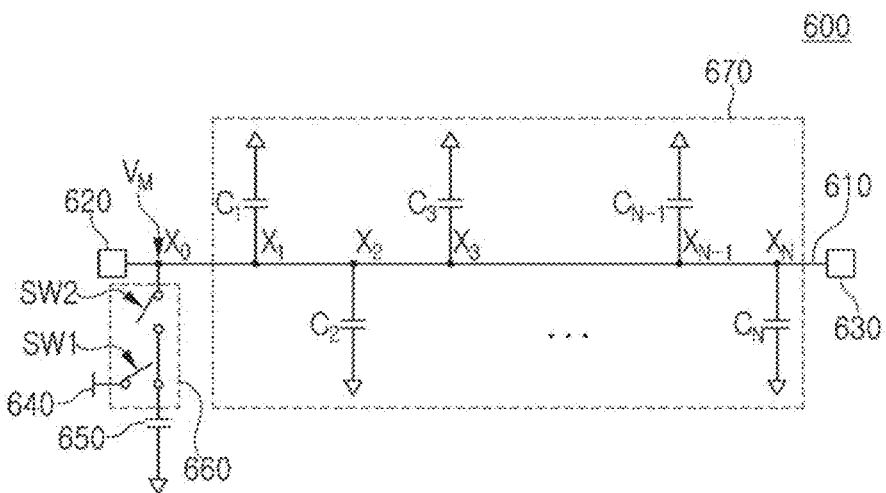
FIG. 9 is a diagram illustrating a circuit for detecting defects according to one or more example embodiments of the present disclosure.
Figure 10:
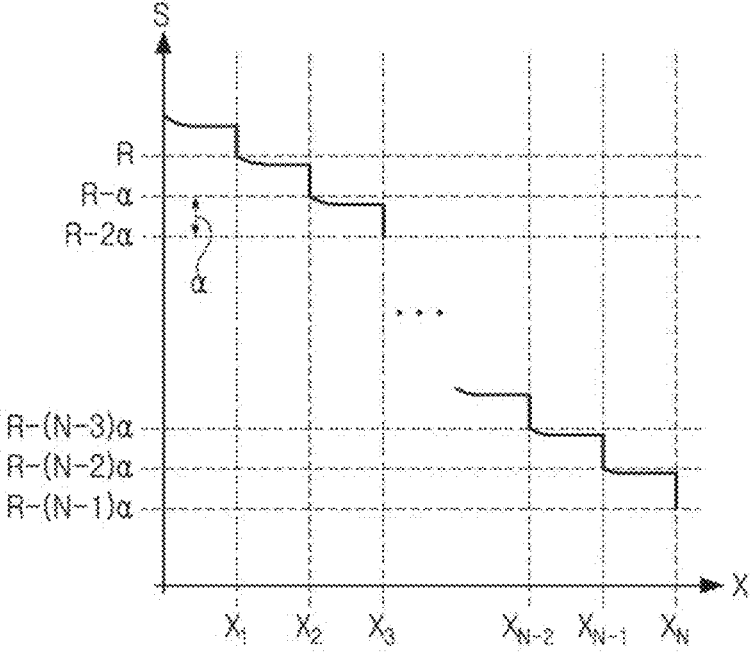
FIG. 10 is a diagram illustrating a ratio of measured voltage and reference voltage depending on a position of defects according to one or more example embodiments of the present disclosure.

FIG. 9 is a diagram illustrating a circuit for detecting defects according to one or more example embodiments of the present disclosure. FIG. 10 is a diagram illustrating a ratio of measured voltage and reference voltage depending on a position of defects according to one or more example embodiments of the present disclosure.

Referring to FIG. 9, the circuit 600 for detecting defects may include a defect detection conductor 610, an input pad 620, an output pad 630, and a defect detection assembly. The input pad 620 may be connected to one end of the defect detection conductor 610, and the output pad 630 may be connected to the other end of the defect detection conductor 610. The defect detection assembly may include a reference voltage supply 640, a reference capacitor 650, a switching assembly 660, and a plurality of detection capacitors 670. As compared to the circuit 500 for detecting defects in FIG. 7, the plurality of detection capacitors 670 may be configured differently, and specific example embodiments may be similar to the examples described with reference to FIG. 7.

The plurality of detection capacitors 670 according to one or more example embodiments may include first to Nth detection capacitors C1-CN. The first to Nth detection capacitors C1-CN may be connected in parallel between the input pad 620 and the output pad 630.

The first detection capacitor C1 may be connected to the first position X1 of the defect detection conductor 610, the second detection capacitor C2 is connected to the second position X2 of the defect detection conductor 610, the Nth−1 detection capacitor CN−1 may be connected to the Nth−1 position XN−1 of the defect detection conductor 610, and the Nth detection capacitor CN may be connected to the Nth position XN of the defect detection conductor 610. As illustrated in FIG. 9, for example, the first to Nth detection capacitors C1-CN may be disposed and spaced apart at the same distance from each other. In other words, the first position X1 to the Nth position XN may be disposed and spaced apart on the defect detection conductor 610 at the same distance from each other.

FIG. 10 is a diagram illustrating a ratio of measured voltage to reference voltage according to positions of defects according to one or more example embodiments illustrated in FIG. 9. The positions X of defects may correspond to a position between the 0th position X0 and the Nth position XN of the defect detection conductor 610. The measurement voltage $V_M$ may be measured at a node at the 0th position X0. The reference voltage may be supplied by the reference voltage supply 640 to the reference capacitor 650.

For example, each of the first to Nth detection capacitors C1-CN may have different capacitance values. A sum of capacitance values of the first to Nth detection capacitors C1-CN may be equal to a capacitance value of the reference capacitor 650. In this case, each of the first to Nth detection capacitors C1-CN may satisfy a capacitance value $C_{STD}$ of the reference capacitor 650 and Equation (1).

$$CN = ak \times CSTD \ (k = \{1, 2, 3, \ldots, N\}) \tag{1}$$

For example, a1 of the first detection capacitor C1 may satisfy Equation (2), and ak of the second to Nth detection capacitors C2-CN may satisfy Equation (3).

US 12,644,923 B2

17

$$a1 = \frac{1}{R} - 1 \quad (2)$$

$$ak = \frac{1}{R - (k-1) \times \alpha} - \frac{1}{R - (k-2) \times \alpha} (k = \{2, 3, \ldots, N\}) \quad (3)$$

R may correspond to a ratio S value of the measurement voltage $V_M$ to the reference voltage at first position X1. For example, R may correspond to a value divided by a sum of the capacitance value $C_{STD}$ of the reference capacitor 650 and a capacitance value of the first detection capacitor C1. In an example, R may correspond to 0.9, 0.8, or 0.7, but example embodiments thereof are not limited thereto. α may correspond to the amount by which the ratio S of the measurement voltage $V_M$ to the reference voltage decreases when a disconnection occurs between adjacent positions among the first position to the Nth position X1-XN. For example, α may be 0.1 or 0.2, but example embodiments thereof are not limited thereto.

By designing the number of detection capacitors included in the plurality of detection capacitors 670 and a capacitance value of each detection capacitor, the number of defect testing positions of the defect detection conductor 610 and the amount by which the ratio S of the measurement voltage $V_M$ to the reference voltage decreases at each defect testing position. Accordingly, accuracy in detecting positions of defects may be improved through the measurement voltage $V_M$.

Figure 11:
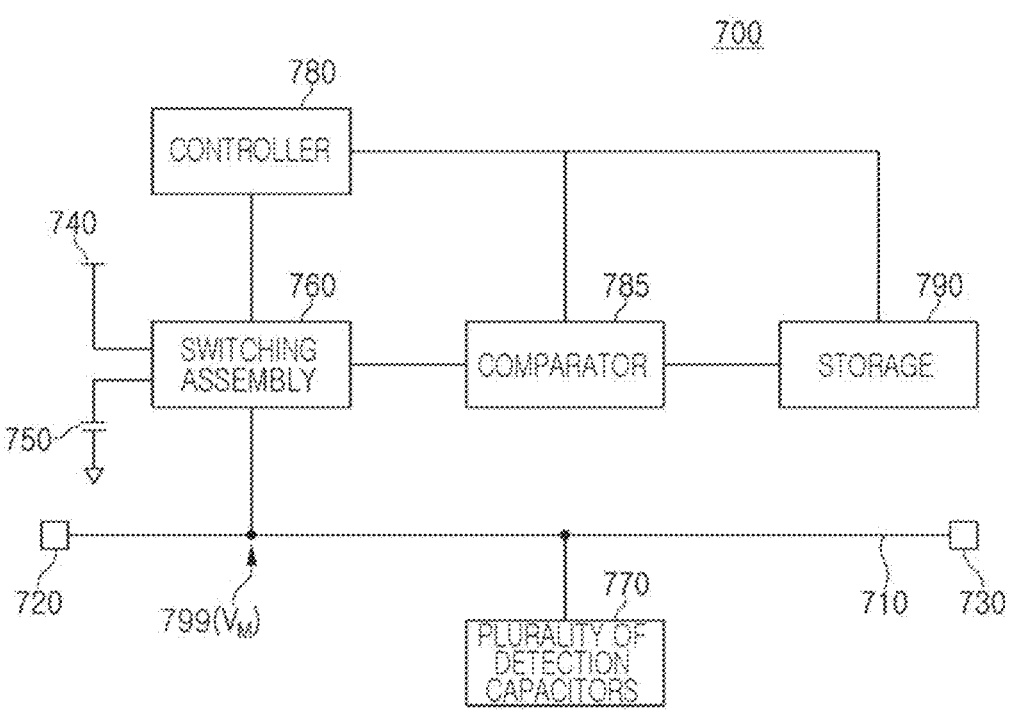
FIG. 11 is a diagram illustrating a circuit for detecting defects according to one or more example embodiments of the present disclosure.

FIG. 11 is a diagram illustrating a circuit for detecting defects according to one or more example embodiments of the present disclosure.

Referring to FIG. 11, the circuit 700 for detecting defects may include a defect detection conductor 710, an input pad 720, an output pad 730, a defect detection assembly, a controller 780, a comparator 785, and a storage 790. The input pad 720 may be connected to one end of the defect detection conductor 710, and the output pad 730 may be connected to the other end of the defect detection conductor 710. The defect detection assembly may include a reference voltage supply 740, a reference capacitor 750, a switching assembly 760, and a plurality of detection capacitors 770.

In example embodiments, the controller 780 may control the defect detection assembly to measure the measurement voltage $V_M$ at a node 799 at which the switching assembly 760 is connected to the defect detection conductor 710. Specifically, the controller 780 may control the switching assembly 760 such that the reference capacitor 750 may be connected to the reference voltage supply 740 and may be charged with the reference voltage. Thereafter, the switching assembly 760 may be controlled such that the reference capacitor 750 charged with the reference voltage may be connected to the plurality of detection capacitors 770. In example embodiments, the capacitor composite value of the plurality of detection capacitors 770 may be determined according to the positions of defects of the defect detection conductor 710. Accordingly, the presence of defects and positions of defects may be detected using the measurement voltage $V_M$.

The comparator 785 may compare the measurement voltage $V_M$ and a comparison reference voltage $V_{REF}$ through the controller 780 and may output the comparison result. A minimum value of the comparison reference voltage $V_{REF}$ may correspond to the measurement voltage $V_M$ when the reference capacitor 750 is connected to the plurality of detection capacitors 770 when there are no defects in the defect detection conductor 710. A maximum value of the comparison reference voltage $V_{REF}$ may correspond to the reference voltage supplied by the reference voltage supply 740. The storage 790 may convert the comparison result of the comparator 785 into digital information through the controller 780, may store the information, and may output the information.

Figure 12:
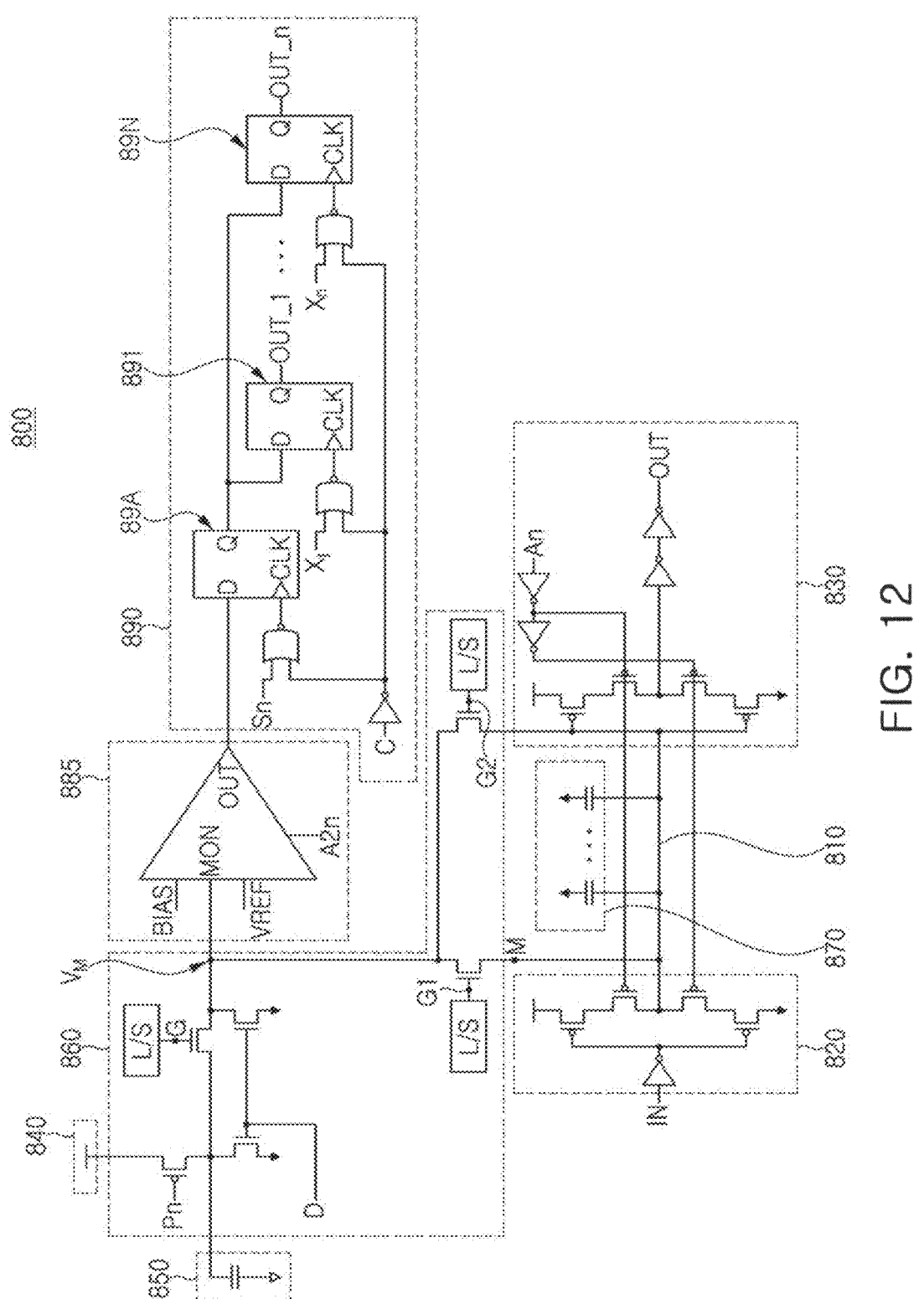
FIG. 12 is a diagram illustrating a circuit for detecting defects according to one or more example embodiments of the present disclosure.
Figure 13:
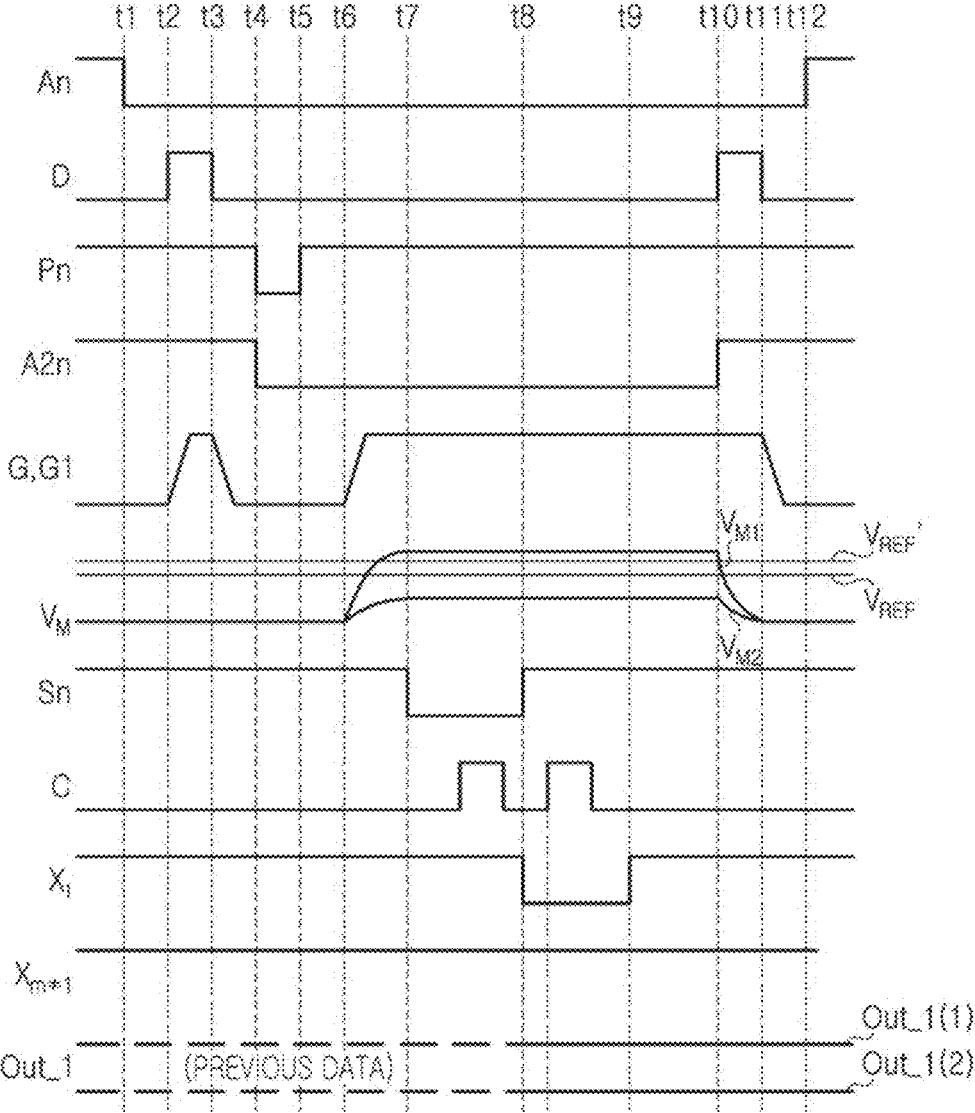
FIG. 13 is a diagram illustrating digital output signals for signals input to a circuit for detecting defects and measurement results according to one or more example embodiments of the present disclosure.

FIG. 12 is a diagram illustrating a circuit for detecting defects according to one or more example embodiments of the present disclosure. FIG. 13 is a diagram illustrating digital output signals for signals input to a circuit for detecting defects and measurement results according to one or more example embodiments of the present disclosure.

Referring to FIG. 12, a circuit 800 for detecting defects may include a defect detection conductor 810, an input control circuit 820, an output control circuit 830, a defect detection assembly, a controller, a comparator 885, and a storage 890.

The input control circuit 820 may be connected to one end of the defect detection conductor 810, and the output control circuit 830 may be connected to the other end of the defect detection conductor 810. The input signal IN may be output from an input pad through a logic circuit and may input into the input control circuit 820. The input control circuit 820 may transmit the input signal IN to the defect detection conductor 810, or may electrically separate the input pad from the defect detection conductor 810. The output signal OUT may be output from the output pad through a logic circuit and may input into the output control circuit 830. The output control circuit 830 may transmit the output signal OUT to the defect detection conductor 810, or the output pad may be electrically separated from the defect detection conductor 810.

The defect detection assembly may include a reference voltage supply 840, a reference capacitor 850, a switching assembly 860, and a plurality of detection capacitors 870. In example embodiments, the controller may control the circuit for detecting defects through the signals in FIG. 13. The controller may supply a control signal to the circuit 800 for detecting defects, and an output signal of the circuit 800 for detecting defects may be input to the controller.

The switching assembly 860 may be connected to a position adjacent to the input control circuit 820 of the defect detection conductor 810, and in this case, a low level voltage may be applied to the G2 node. For example, the low level voltage may be 0V. At a first time point t1, a signal of the output control circuit 830 may change from a high level to a low level, and both ends of the defect detection conductor 810 may be separated. A separation state of the defect detection conductor 810 may be maintained until a twelfth time point t12. At a second time point t2, a D signal of the switching assembly 860 may change from a low level to a high level, and a voltage of G and G1 nodes may be increased from 0V to a constant voltage. In this case, a constant voltage of the G and G1 nodes may be a voltage amplified through each of lever shifters (L/S) connected to G and G1. For example, a constant voltage may be 3V to 3.5V. In this case, the reference capacitor 850 may be connected to ground 0V such that the amount of residual charge in the reference capacitor 850 may be dissipated. At a third time point t3, the D signal of the switching assembly 860 may change from a high level to a low level, and a voltage of the G and G1 nodes may be reduced to 0V. In this case, the measurement voltage $V_M$ may be 0V.

At a fourth time point t4, a Pn signal of the switching assembly 860 and a A2n signal of the comparator 885 may change from a high level to a low level. For example, a high level value of an $A2n$ signal may be a reference voltage supplied by the reference voltage supply 840, and a low level value of an $A2n$ signal may be 0V. In this case, the reference capacitor 850 may be connected to the reference voltage supply 840 by the Pn signal. Also, the comparator 885 may be activated by the $A2n$ signal, and an activation state may be maintained until a tenth time point t10. At a fifth time point t5, the Pn signal may change from a low level to a high level, and connection between the reference capacitor 850 and the reference voltage supply 840 may be disconnected.

At a sixth time point t6, a voltage of the G and G1 nodes may be increased from 0V to a constant voltage. For example, the constant voltage may be 3V to 3.5V. In this case, the reference capacitor 850 may be connected to the plurality of detection capacitors 870. In other words, the measurement voltage $V_M$ may be applied to an input node MON of the comparator 885, and the measurement voltage $V_M$ may be input to the comparator 885, such that comparator 885 may output a comparison result.

At a seventh time point t7, an Sn signal of the storage 890 may change from a high level to a low level, and the low level may be maintained until an eighth time point t8. A C signal of the storage 890 may have a high level period between the seventh time point t7 and the eighth time point t8, and during the high level period of the C signal, during the high level period of the C signal, the 0th delay flip-flop (DFF) 89A may receive a comparison result of the comparator 885 and may be converted to a digital signal.

Between the eighth time point t8 and the ninth time point t9, the C signal of the storage 890 may have a high level period. The high level period of the C signal may be included in a period in which one of the X1 signals of the first DFF 891 to the Xn signal of the Nth DFF 89N may have a low level.

In example embodiments, the Sn signal of the storage 890 may change from a low level to a high level at the eighth time point t8. During the eighth time point t8 to the ninth time point t9, a digital signal may be stored in one of the first DFF 891 to the Nth DFF 89N. For example, at the eighth time point t8, among the first DFF 891 to the Nth DFF 89N, the X1 signal of first DFF 891 may change from a high level to a low level, and the low level of X1 of the first DFF 891 may change from a low level to a high level before the ninth time point t9. In this case, the X2 to Xn signals of the remaining DFFs may maintain a high level other than the X1 signal of the first DFF 891.

In a portion of periods of the time in which the X1 signal of the first DFF 891 is maintained at a low level, the C signal of the storage 890 may have a high level period. At the time point at which the C signal changes to high level, the digital signal stored in the 0th DFF 89A may be transferred to the first DFF 891 and may be stored, and thereafter, the X1 signal may be changed to a high level to maintain storage of the digital signal. Also, from the time point at which the C signal changes to a high level, the first DFF 891 may output the first output signal Out_1 for the stored digital signal.

After the X1 signal of the first DFF 891 changes from a low level to a high level, the above operation may be repeated by changing the comparison reference voltage $V_{REF}$. Specifically, the X2 to Xn signals of the second to Nth DFFs may sequentially have a low level period. When the C signal of the storage 890 changes from a low level to a high level in each low level period of the X2, digital signals may be stored in the second to Nth DFF, and the second to the Nth DFF may output output signals Out_2-Out_N for the stored digital signals.

In example embodiments, the measurement voltage $V_M$ may be the first measured voltage $V_{M1}$, which is higher than the comparison reference voltage $V_{REF}$, or the second measured voltage $V_{M2}$, which is lower than the comparison reference voltage $V_{REF}$. When the measurement voltage $V_M$ is the first measured voltage $V_{M1}$, the first DFF 891 may output a first output signal Out_1(1), which has a value of 1. For example, when the measurement voltage $V_M$ is the second measured voltage $V_{M2}$, the second DFF may output the first output signal Out_1(2), which has a value of 0. In other words, when the measurement voltage $V_M$ is higher than the comparison reference voltage $V_{REF}$, the first DFF 891 may output 1, and when the measurement voltage $V_M$ is lower than the comparison reference voltage $V_{REF}$, the first DFF 891 may output 0.

Thereafter, the comparison reference voltage $V_{REF}$ may be changed in sequence, and the second to Nth DFFs may output the second to Nth output signals Out_2-Out_N. For example, the Nth DFF 89N may output an Nth output signal Out_N on the basis of the changed comparison reference voltage $V_{REF}'$. The measurement voltage $V_M$ may be the first measured voltage $V_{M1}$, which is higher than the changed comparison reference voltage $V_{REF}'$, or the second measured voltage $V_{M2}$, which is lower than the comparison reference voltage $V_{REF}$. When the measurement voltage $V_M$ is the first measured voltage $V_{M1}$, the Nth DFF 89N may output the Nth output signal Out_n(1), which has a value of 1. For example, when the measurement voltage $V_M$ is the second measured voltage $V_{M2}$, the Nth DFF 89N may output the Nth output signal Out_n(2), which has a value of 0. In other words, when the measurement voltage $V_M$ is higher than the comparison reference voltage $V_{REF}$, the Nth DFF 89N may output 1, and when the measurement voltage $V_M$ is lower than the comparison reference voltage $V_{REF}$, the Nth DFF 89N may output 0.

At the tenth time point t10, the $A2n$ signal may change to a high level such that the comparator 885 may be deactivated, and the D signal of the switching assembly 860 may change to a high level such that the M node may be connected to ground. At eleventh time point t11, the D signal may change from a high level to a low level, and the G and G1 node voltages may be reduced to 0V. In this case, the M node may be maintained at 0V. At the twelfth time point t12, an An signal may change to a high level, and the defect detection conductor 810 may be reconnected to the input control circuit 820 and the output control circuit 830.

In example embodiments, disconnection of the defect detection conductor 810 and a disconnection position may be detected using the first to Nth output signals Out_1-Out_N of the storage 890. The comparison reference voltage $V_{REF}$ input to the comparator 885 may be changed and operation from the first time point t1 to the twelfth time point t12 may be repeated. For example, a minimum value of the comparison reference voltage $V_{REF}$ may be input into the comparator 885 and the operation described above may be performed, and the operations may be repeatedly performed while constantly increasing the comparison reference voltage $V_{REF}$. When the output signal Out_1-Out_N of the storage 890 changes from 1 to 0, it may be detected that the defect detection conductor 810 is disconnected. Also, the disconnection position may be detected using a voltage value of the comparison reference voltage $V_{REF}$ at which the first to Nth output signals Out_1-Out_N of the storage 890 changes from 1 to 0. Accordingly, whether defects are present and positions of defects caused by cracks in the periphery of the semiconductor device or cracks in the bonding pad may be detected, thereby improving reliability of the semiconductor device.

The switching assembly 860 in FIG. 12 may be connected to a position adjacent to the input control circuit 820 of the defect detection conductor 810, and defects may be detected using the voltage of the G and G1 nodes. In another example embodiment, the switching assembly 860 in FIG. 12 may be connected to a position adjacent to the output control circuit 830 of the defect detection conductor 810, and defects may be detected using the voltage of the G and G2 nodes.

Figure 14:
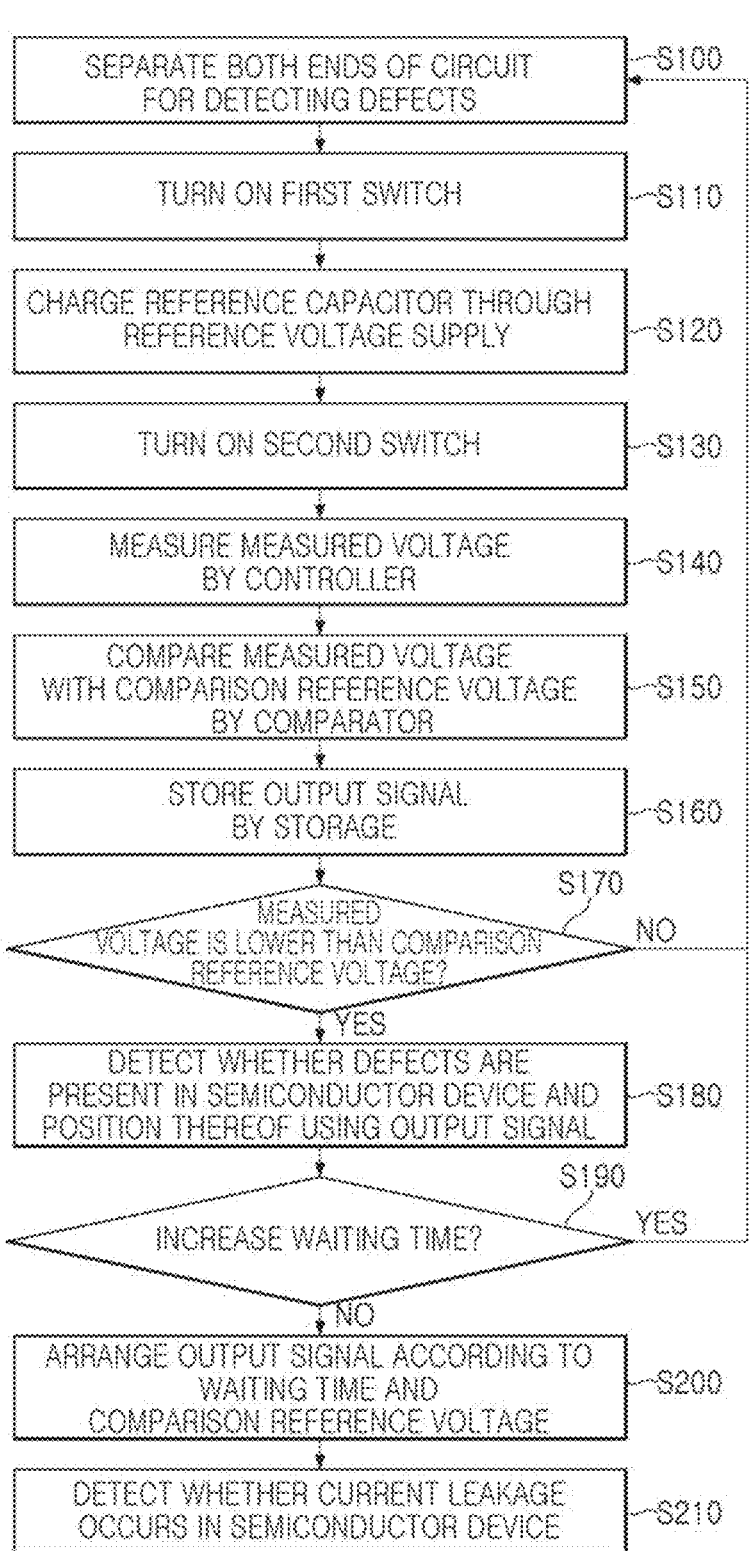
FIG. 14 is a flowchart illustrating a method for detecting defects according to one or more example embodiments of the present disclosure.

FIG. 14 is a flowchart illustrating a method for detecting defects according to one or more example embodiments of the present disclosure.

The circuit for detecting defects may include a defect detection conductor, an input pad, an output pad, a defect detection assembly, a controller, a comparator, and a storage. A defect detection conductor may be disposed in a peripheral region of the semiconductor die. The input pad may be connected to one end of the defect detection conductor, and the output pad may be connected to the other end of the defect detection conductor.

The defect detection assembly may be connected to the defect detection conductor and may detect defects of the defect detection conductor. The defect detection assembly may include a reference voltage supply, a reference capacitor, a switching assembly, and a plurality of detection capacitors. The switching assembly may include a first switch connecting the reference capacitor to the reference voltage supply, and a second switch connecting the reference capacitor to a position adjacent to the input pad of the defect detection conductor. A plurality of detection capacitors may be connected between the input pad and the output pad in parallel.

The controller may separate both ends of the circuit for detecting defects using the input pad and the output pad in operation S100. The controller may turn on the first switch in operation S110. In this case, the reference capacitor may be connected to the reference voltage supply, and the reference capacitor may be charged through the reference voltage supply in operation S120.

Thereafter, the controller may turn off the first switch and may turn on the second switch in operation S130. In this case, the reference capacitor may be connected to a position adjacent to the input pad of the defect detection conductor. The reference capacitor may be connected in parallel with a plurality of detection capacitors, and the controller may measure the measurement voltage at a node at which the switching assembly is connected to the defect detection conductor in operation S140. The measurement voltage may be determined according to a capacitor composite value of the plurality of detection capacitors.

The comparator may compare the measurement voltage with the comparison reference voltage in operation S150. For example, the comparator may repeatedly perform an operation of comparing the measurement voltage with the minimum voltage among the plurality of comparison reference voltages until the measurement voltage falls lower than the comparison reference voltage. A minimum voltage among comparison reference voltages may correspond to the measurement voltage when the reference capacitor is connected to the plurality of detection capacitors when no defects are present in the defect detection conductor. A maximum voltage of the comparison reference voltage may correspond to the reference voltage supplied by the reference voltage supply.

The comparator may output the comparison result, and the storage may store an output signal output by the comparator in the 0th DFF and may store the signal in one of the first to Nth output signals Out_1-Out_N in operation S160. This process may correspond to the process from the first time point t1 to the twelfth time point t12 as illustrated in FIG. 13.

In operation S170, it may be determined whether the measured voltage is lower than a comparison reference voltage. When the measurement voltage is higher than the comparison reference voltage (NO in S170), the output signal output by the storage may correspond to 1. Also, the controller may separate both ends of the circuit for detecting defects again (operation S100) and may repeat the subsequent process (operations S110-S160). Specifically, the controller may change the comparison reference voltage input to the comparator. For example, the controller may increase the comparison reference voltage by a determined width, and the comparator may compare the measurement voltage with the comparison reference voltage again.

When the measurement voltage is lower than the comparison reference voltage (YES in S170), an output signal output by the storage may correspond to 0. In this case, whether defects are present in the semiconductor device and a position thereof may be detected through the applied comparison reference voltage in operation S180. In other words, to determine the disconnection position according to the comparison reference voltage applied when 1 to 0 are applied to the output signal Out_1-Out_N, to determine the disconnection position according to the applied comparison reference voltage, the process illustrated in the first time point t1 to the twelfth time point t12 illustrated in FIG. 13 may be repeatedly performed.

In operation S190, it may be determined whether to increase a waiting time. When a waiting time is increased (YES in S190), the controller may measure the measurement voltage again (operation S100) and may repeat the subsequent processes (operations S110-S180). In example embodiments, the waiting time may correspond to the time between the time point at which the first switch is turned off and the second switch is turned on (operation S130) and the time point at which the measurement voltage is measured at a node at which the switching assembly is connected to the defect detection conductor (operation S140). When the waiting time is not increased (NO in S190), the output signal Out_1-Out_N in operation S180 may be arranged according to the comparison reference voltage when measuring the waiting time and the output signals Out_1-Out_N in operation S200. Accordingly, current leakage of the semiconductor device may be detected in operation S210, and specifically, current leakage of the defect detection conductor over time may be detected.

FIGS. 15A to 15E are diagrams illustrating results of a system for detecting defects according to one or more example embodiments of the present disclosure. The results of the system for detecting defects may appear as in the example embodiments illustrated in FIGS. 15A-15E. Specifically, an output signal may be arranged according to the waiting time WT corresponding to the time point at which the second switch turns on (operation S130 of FIG. 14) and the time point at which the measurement voltage is measured at a node at which the switching assembly is connected to the defect detection conductor (operation S140 of FIG. 14), and the comparison reference voltage $V_{REF}$ (operation S180 of FIG. 14).

FIGS. 15A to 15E may represent the results of arranging the output signal according to the waiting time and the reference voltage in the circuit for detecting defects configured the same. Specifically, the horizontal axis of each FIGS. 15A to 15E may correspond to the waiting time WT corresponding to the time point at which the second switch turns on (operation S130 of FIG. 14) and the time point at which the measurement voltage is measured at a node at which the switching assembly is connected to the defect detection conductor (operation S140 of FIG. 14), and the vertical axis may correspond to the comparison reference voltage V$_{REF}$. For example, when the measurement voltage is 0.65 and the plurality of comparison reference voltages are 0.5 V$_{REF, MIN}$, 0.6, 0.7, 0.8 V$_{REF, MAX}$, respectively, when the comparator compares the measurement voltage from the lower voltage among the comparison reference voltages, the output signal may be output in the order of "1," "1," "0," and "0" in the waiting time WT.

Through FIGS. 15A to 15E, whether defects are present and positions of defects in the semiconductor device may be detected (operation S180 of FIG. 14). With respect to a single waiting time WT, when the output signal is divided as 1 and 0 according to the comparison reference voltage V$_{REF}$, it may be determined that defects are present in the semiconductor device. According to each of FIGS. 15A to 15E, the output signal may be divided into 1 and 0 on the basis of the single waiting time WT (WT1-WT4) according to the comparison reference voltage V$_{REF}$, such that it may be determined that defects are present in the semiconductor device. Comparing FIGS. 15A to 15E, the comparison reference voltage V$_{REF}$, at which the output signal is divided into 1 and 0 in the first waiting time WT1, FIGS. 15C to 15E may be higher than FIGS. 15A and 15B. In other words, the position in which defects occur in FIGS. 15C to 15E may be closer to the input pad than the position in which defects occur in FIGS. 15A and 15B. For example, when the output signal is 0 at the entirety of the reference voltages V$_{REF}$ with respect to the waiting time WT, it may be determined that no defects are present in the semiconductor device.

Also, through FIGS. 15A to 15E, current leakage of the semiconductor device may be detected (operation S200 of FIG. 14). For example, current leakage of a defect detection conductor included in the semiconductor device may be detected. Depending on the waiting time WT, when the comparison reference voltage V$_{REF}$, at which the output signal is divided into 1 and 0, decreases, it may be determined that current leakage may occur in the semiconductor device.

In FIGS. 15A and 15C, the comparison reference voltage V$_{REF}$, at which the output signal is divided into 1 and 0, may be constant depending on the waiting time WT. The notion that the comparison reference voltage, at which the output signal is divided into 1 and 0, is constant may indicate that the measurement voltage may fall within the same voltage range even when the waiting time WT has elapsed. Accordingly, when the comparison reference voltage at which the output signal is divided into 1 and 0 is constant, it may be determined that no current leakage occurs.

In FIGS. 15B, 15D, and 15E, the comparison reference voltage V$_{REF}$, at which the output signal is divided into 1 and 0, is reduced depending on the waiting time WT, such that, in FIGS. 15B, 15D, and 15E, it may be determined that current leakage has occurred.

Specifically, in FIGS. 15D and 15E, the comparison reference voltage V$_{REF}$, at which the output signal at the first waiting time WT1 is divided into 1 and 0, may be the same. Depending on the waiting time WT, the comparison reference voltage V$_{REF}$, which divides the output signal into 1 and 0, may decrease, such that it may be determined that current leakage has occurred. Also, when slopes of the graphs are different, it may be determined that the degrees of current leakage may be different. Specifically, the slope at which the comparison reference voltage V$_{REF}$, at which the output signal in FIG. 15D is divided into 1 and 0, is reduced may be greater than the slope in FIG. 15E. In this case, it may be determined that the degree of current leakage appearing in FIG. 15D may be greater than the degree of current leakage appearing in FIG. 15E.

According to the aforementioned example embodiments, by disposing the circuit for detecting defects which may detect defects occurring in a semiconductor die, and disposing the defect detection conductor in the periphery of the semiconductor die or the periphery of each semiconductor die region, defects may be detected. The circuit for detecting defects may include a reference voltage supply, a reference capacitor, and a plurality of detection capacitors connected in parallel to the defect detection conductor, and by measuring a voltage of a node at which the reference capacitor and the plurality of detection capacitors are connected to each other and comparing the voltage with the comparison reference voltage, defects may be detected, such that reliability of semiconductor devices may be maintained.

At least one of the devices, units, components, modules, units, or the like represented by a block or an equivalent indication in the above embodiments including, but not limited to, FIG. 11 may be physically implemented by analog and/or digital circuits including one or more of a logic gate, an integrated circuit, a microprocessor, a microcontroller, a memory circuit, a passive electronic component, an active electronic component, an optical component, and the like, and may also be implemented by or driven by software and/or firmware (configured to perform the functions or operations described herein).

At least one of the devices, units, components, modules, units, or the like (collectively "devices") represented by a block or an equivalent indication in the above embodiments including, but not limited to, the "controller 780", may be physically implemented by analog and/or digital circuits including one or more of a logic gate, an integrated circuit, a microprocessor, a microcontroller such as a central processing unit (CPU), a memory circuit, a passive electronic component, an active electronic component, an optical component, and the like, and the functions or operations of the devices may be implemented by or driven by software and/or firmware executed by the devices.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:

1. A circuit for detecting defects, the circuit comprising:
a defect detection conductor provided in a peripheral region of a semiconductor die;
an input pad connected to a first end of the defect detection conductor;
an output pad connected to a second end of the defect detection conductor;
a defect detection assembly connected to the defect detection conductor and configured to detect a defect of the defect detection conductor; and a controller configured to control operations of the defect detection assembly, wherein the defect detection assembly comprises a reference voltage supply, a reference capacitor, a switching assembly, and a plurality of detection capacitors, wherein the switching assembly is configured to connect the reference capacitor to one of the reference voltage supply, a position adjacent to the input pad of the defect detection conductor, and a position adjacent to the output pad of the defect detection conductor, and wherein the plurality of detection capacitors are connected between the input pad and the output pad in parallel.

2. The circuit of claim 1, wherein the plurality of detection capacitors are spaced apart from each other by a substantially same distance.

3. The circuit of claim 1, wherein each of the plurality of detection capacitors is provided at a vertex of the semiconductor die.

4. The circuit of claim 1, wherein each of the plurality of detection capacitors has different capacitance values.

5. The circuit of claim 4, wherein a sum of the different capacitance values of each of the plurality of detection capacitors is equal to a capacitance value of the reference capacitor.

6. The circuit of claim 1, wherein the switching assembly comprises:

a first switch configured to connect the reference capacitor to the reference voltage supply; and a second switch configured to connect the reference capacitor to the position adjacent to the input pad of the defect detection conductor.

7. The circuit of claim 6, wherein the switching assembly further comprises a third switch configured to connect the reference capacitor to the position adjacent to the output pad of the defect detection conductor.

8. The circuit of claim 7, wherein the switching assembly is configured to operate in one of:

a first state in which the first switch is turned on and the second switch and the third switch are turned off;

a second state in which the second switch is turned on and the first switch and the third switch are turned off;

a third state in which the third switch is turned on and the first switch and the second switch are turned off; and a fourth state in which the first switch, the second switch, and the third switch are turned off.

9. The circuit of claim 1, wherein the controller is configured to control the defect detection assembly to measure a measurement voltage at a node at which the switching assembly is connected to the defect detection conductor.

10. The circuit of claim 9, further comprising:

a comparator configured to output a comparison result based on a comparison of the measurement voltage with a plurality of comparison reference voltages; and a storage configured to store the comparison result and to output the stored comparison result as an output signal, wherein the controller is further configured to arrange the output signal based on a waiting time corresponding to a time point at which the switching assembly is connected to the defect detection conductor and a time point at which the measurement voltage is measured, detect whether defects are present in the defect detection conductor, and detect positions of present defects.

11. A circuit for detecting defects, the circuit comprising:

a semiconductor die comprising a first region and a second region;

a first defect detection conductor provided in a peripheral region of the first region;

a second defect detection conductor provided in a peripheral region of the second region;

an input pad connected to a first end of the first defect detection conductor and a first end of the second defect detection conductor;

an output pad connected to a second end of the first defect detection conductor and a second end of the second defect detection conductor;

a first defect detection assembly connected to the first defect detection conductor and configured to detect a defect of the first defect detection conductor;

a second defect detection assembly connected to the second defect detection conductor and configured to detect a defect of the second defect detection conductor; and a controller configured to control the first defect detection assembly and the second defect detection assembly, wherein the first defect detection assembly comprises a first reference voltage supply, a first reference capacitor, a first switching assembly, and a plurality of first detection capacitors, wherein the first switching assembly is configured to connect the first reference capacitor to one of the first reference voltage supply, a position adjacent to the input pad of the first defect detection conductor, and a position adjacent to the output pad of the first defect detection conductor, wherein the second defect detection assembly comprises a second reference voltage supply, a second reference capacitor, a second switching assembly, and a plurality of second detection capacitors, and wherein the second switching assembly is configured to connect the second reference capacitor to one of the second reference voltage supply, a position adjacent to the output pad of the second defect detection conductor, and a position adjacent to the output pad of the second defect detection conductor.

12. The circuit of claim 11, wherein the first region and the second region extend in a first direction parallel to an upper surface of the semiconductor die, and wherein the first region and the second region contact each other in a second direction parallel to the upper surface of the semiconductor die and perpendicular to the first direction.

13. The circuit of claim 11, wherein the plurality of first detection capacitors are connected to the first defect detection conductor in parallel and are spaced apart from each other by a substantially same distance, and wherein each of the plurality of first detection capacitors have different capacitance values.

14. The circuit of claim 13, wherein a sum of the different capacitance values of each of the plurality of first detection capacitors is equal to a first reference capacitance value.

15. The circuit of claim 11, wherein the plurality of second detection capacitors are connected to the second defect detection conductor in parallel and are spaced apart from each other by a substantially same distance, and wherein each of the plurality of second detection capacitors have different capacitance values.

16. The circuit of claim 15, wherein a sum of different capacitance values of each of the plurality of second detection capacitors is equal to a second reference capacitance value.

US 12,644,923 B2

27

17. The circuit of claim 11,
wherein the first switching assembly comprises:
a first switch configured to connect the first reference capacitor to the first reference voltage supply; and
at least one of:
a second switch configured to connect the first reference capacitor to the position adjacent to the input pad of the first defect detection conductor; and
a third switch configured to connect the first reference capacitor to the position adjacent to the output pad of the first defect detection conductor, and
wherein the second switching assembly comprises:
a fourth switch configured to connect the second reference capacitor to the second reference voltage supply; and
at least one of:
a fifth switch configured to connect the second reference capacitor to the position adjacent to the output pad of the second defect detection conductor; and
a sixth switch configured to connect the second reference capacitor to the position adjacent to the output pad of the second defect detection conductor.

18. The circuit of claim 17,
wherein the first switching assembly is configured to operate in one of:
a first state in which the first switch is turned on and the second switch and the third switch are turned off;
a second state in which the second switch is turned on and the first switch and the third switch are turned off;
a third state in which the third switch is turned on and the first switch and the second switch are turned off; and
a fourth state in which the first to third switches are turned off, and
wherein the second switching assembly is configured to operate in one of:
a fifth state in which the fourth switch is turned on and the fifth switch and the sixth switch are turned off;
a sixth state in which the fifth switch is turned on and the fourth switch and the sixth switch are turned off;

a seventh state in which the sixth switch is turned on and the fourth switch and the fifth switch are turned off; and
an eighth state in which the fourth to sixth switches are turned off.

19. The circuit of claim 11, wherein the controller is configured to measure a first measured voltage at a node at which the first switching assembly is connected to the first defect detection conductor and a second measured voltage at a node at which the second switching assembly is connected to the second defect detection conductor.

20. A circuit for detecting defects, the circuit comprising:
a defect detection conductor provided on a peripheral region of a semiconductor die;
an input pad connected to a first end of the defect detection conductor;
an output pad connected to a second end of the defect detection conductor;
a defect detection assembly connected to the defect detection conductor and configured to detect a defect of the defect detection conductor; and
a controller configured to control operations of the defect detection assembly,
wherein the defect detection assembly comprises a reference voltage supply, a reference capacitor, a switching assembly,
wherein a plurality of detection capacitors are connected to the defect detection conductor in parallel,
wherein the switching assembly comprises:
a first switch configured to connect the reference capacitor to the reference voltage supply; and
a second switch configured to connect the reference capacitor to a position adjacent to the input pad of the defect detection conductor,
wherein, based on the first switch being turned on and the second switch being turned off, the controller is configured to control the reference voltage supply to charge the reference capacitor, and
wherein, based on the first switch being turned off and the second switch being turned on, the controller is configured to measure a voltage between the reference capacitor and at least one of the plurality of detection capacitors.

* * * * *